United States Patent
Sugisawa et al.

(10) Patent No.: US 12,528,956 B2
(45) Date of Patent: Jan. 20, 2026

(54) INK-JET ADHESIVE, METHOD FOR PRODUCING ELECTRONIC COMPONENT, AND ELECTRONIC COMPONENT

(71) Applicant: SEKISUI CHEMICAL CO., LTD., Osaka (JP)

(72) Inventors: Yoshifumi Sugisawa, Osaka (JP); Takashi Watanabe, Osaka (JP); Mitsuru Tanikawa, Osaka (JP); Yusuke Fujita, Osaka (JP); Taichi Hamada, Osaka (JP); Tomoya Tanaka, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 204 days.

(21) Appl. No.: 18/277,127

(22) PCT Filed: Mar. 25, 2022

(86) PCT No.: PCT/JP2022/014273
§ 371 (c)(1),
(2) Date: Aug. 14, 2023

(87) PCT Pub. No.: WO2022/203033
PCT Pub. Date: Sep. 29, 2022

(65) Prior Publication Data
US 2024/0124729 A1    Apr. 18, 2024

(30) Foreign Application Priority Data

Mar. 26, 2021  (JP) ................................ 2021-053725
Jun. 16, 2021  (JP) ................................ 2021-100122

(51) Int. Cl.
C09D 11/30      (2014.01)
C09J 4/06       (2006.01)
(Continued)

(52) U.S. Cl.
CPC ................. *C09D 11/30* (2013.01); *C09J 4/06* (2013.01); *C09J 5/06* (2013.01); *C09J 7/35* (2018.01);
(Continued)

(58) Field of Classification Search
CPC ............ B41J 2/175; H01L 2224/32145; H01L 24/83; H01L 2224/45099; H01L 2924/0665; C09J 11/06; C09J 2203/326
See application file for complete search history.

(56) References Cited

U.S. PATENT DOCUMENTS

| | | | | |
|---|---|---|---|---|
| 6,121,553 A | * | 9/2000 | Shinada | ............... H05K 3/4626 |
| | | | | 428/209 |
| 2005/0133936 A1 | * | 6/2005 | Hosokawa | .......... H01L 23/3107 |
| | | | | 257/E21.502 |

(Continued)

FOREIGN PATENT DOCUMENTS

| | | |
|---|---|---|
| JP | 2009-231605 | 10/2009 |
| JP | 2016-65171 | 4/2016 |

(Continued)

OTHER PUBLICATIONS

International Preliminary Report on Patentability and Written Opinion of the International Searching Authority issued Sep. 12, 2023 in International (PCT) Application No. PCT/JP2022/014273.

(Continued)

*Primary Examiner* — John P Zimmermann
(74) *Attorney, Agent, or Firm* — WENDEROTH, LIND & PONACK, L.L.P.

(57) ABSTRACT

Provided is an ink-jet adhesive that can suppress adhesion of an adhesive component to an unintended region of a transparent member when the transparent member is used as a member to be bonded. The ink-jet adhesive according to the present invention contains a photocurable compound having (Continued)

a (meth) acryloyl group or a vinyl group and having no cyclic ether group, and a photopolymerization initiator, contains or does not contain a thermosetting compound having no (meth) acryloyl group and having a cyclic ether group, and a content of the thermosetting compound is 5 wt % or less when the ink-jet adhesive contains the thermosetting compound.

17 Claims, 4 Drawing Sheets

(51) Int. Cl.
    *C09J 5/06*     (2006.01)
    *C09J 7/35*     (2018.01)
    *C09J 11/04*     (2006.01)
    *C09J 11/06*     (2006.01)
    *C09J 133/06*     (2006.01)
    *H10F 39/00*     (2025.01)

(52) U.S. Cl.
    CPC ............... *C09J 11/04* (2013.01); *C09J 11/06* (2013.01); *C09J 133/068* (2013.01); *H10F 39/024* (2025.01); *H10F 39/806* (2025.01); *H10F 39/811* (2025.01); *C09J 2203/326* (2013.01); *C09J 2301/416* (2020.08)

(56) References Cited

U.S. PATENT DOCUMENTS

| | | | | |
|---|---|---|---|---|
| 2008/0241995 | A1* | 10/2008 | Fukui | H01L 25/50 |
| | | | | 428/40.1 |
| 2012/0248634 | A1 | 10/2012 | Mitsukura et al. | |
| 2012/0256326 | A1 | 10/2012 | Mitsukura et al. | |
| 2012/0263946 | A1 | 10/2012 | Mitsukura et al. | |
| 2017/0158922 | A1 | 6/2017 | Tanikawa et al. | |
| 2017/0233599 | A1* | 8/2017 | Tanikawa | H01L 24/83 |
| | | | | 257/777 |
| 2018/0246381 | A1* | 8/2018 | Wakita | G02F 1/133711 |
| 2019/0270919 | A1* | 9/2019 | Yoshiwara | C08J 3/24 |
| 2019/0337304 | A1* | 11/2019 | Allen | B32B 7/12 |
| 2020/0079086 | A1* | 3/2020 | Asai | B41J 2/14072 |

FOREIGN PATENT DOCUMENTS

| | | |
|---|---|---|
| JP | 2016-147930 | 8/2016 |
| JP | 2017-66313 | 4/2017 |
| JP | 2018-67676 | 4/2018 |
| WO | 2011/058998 | 5/2011 |
| WO | 2016/080069 | 5/2016 |

OTHER PUBLICATIONS

International Search Report (ISR) issued Jun. 7, 2022 in International (PCT) Application No. PCT/JP2022/014273.

* cited by examiner

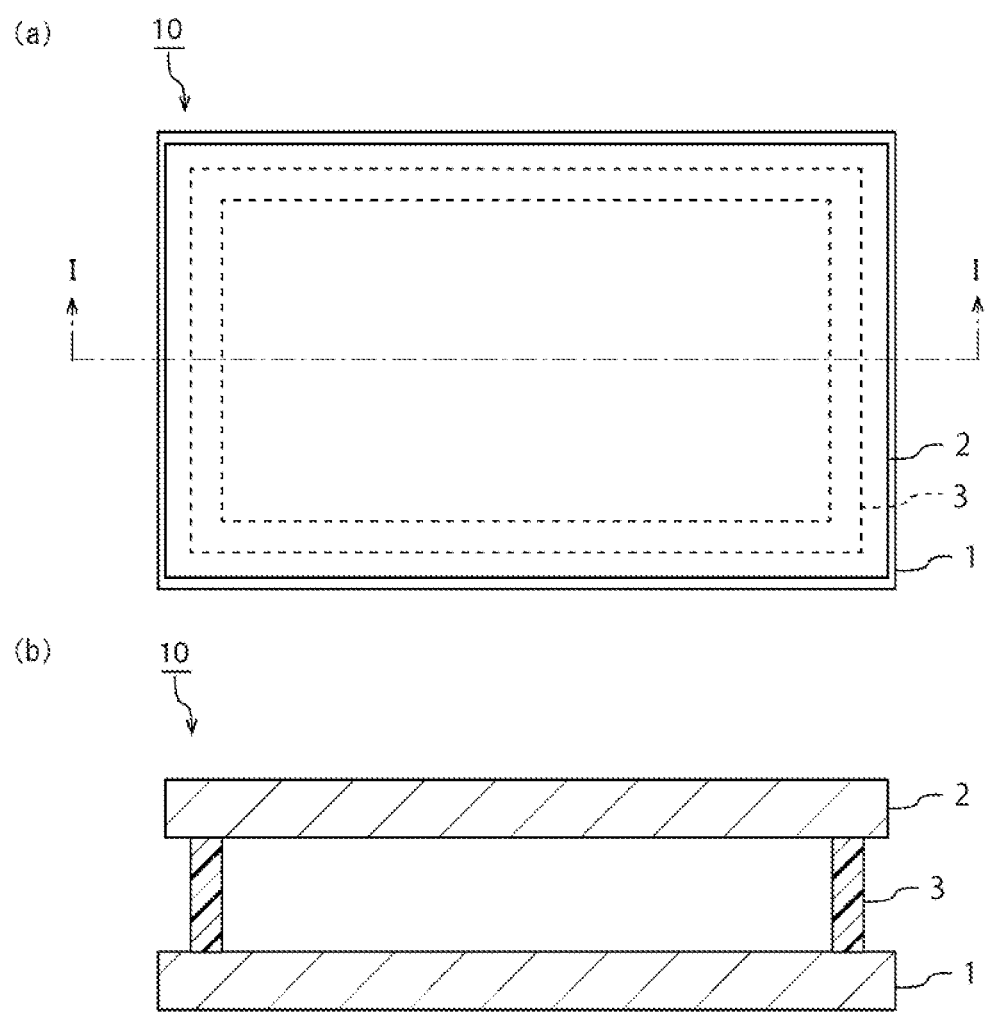
[FIG. 1]

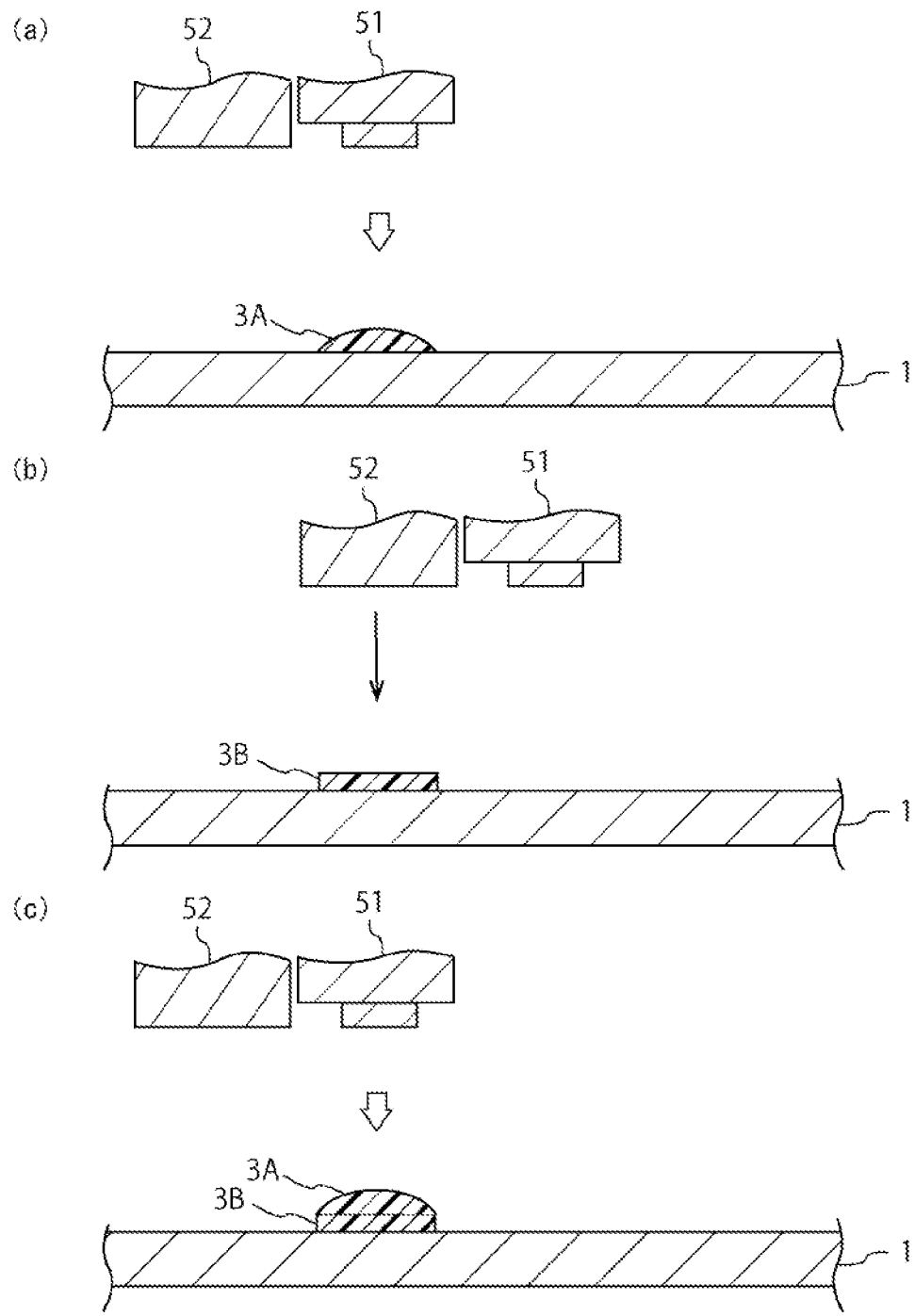
[FIG. 2]

[FIG. 3]
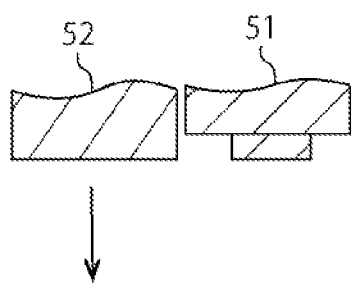
(d)
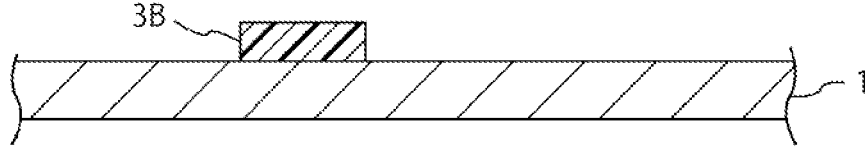
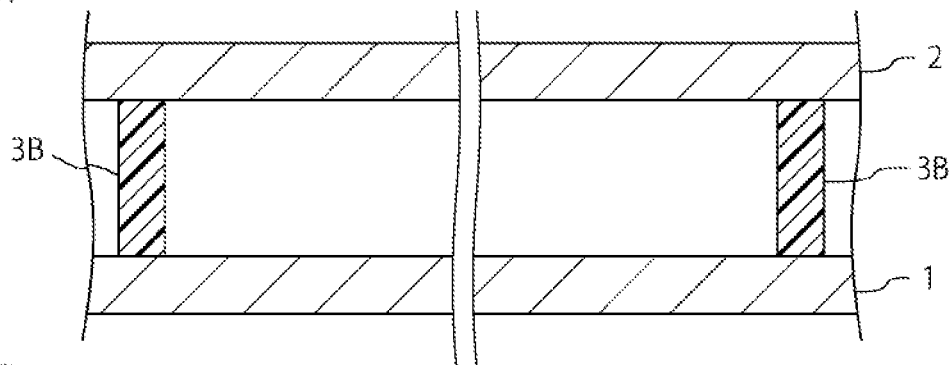
(e)
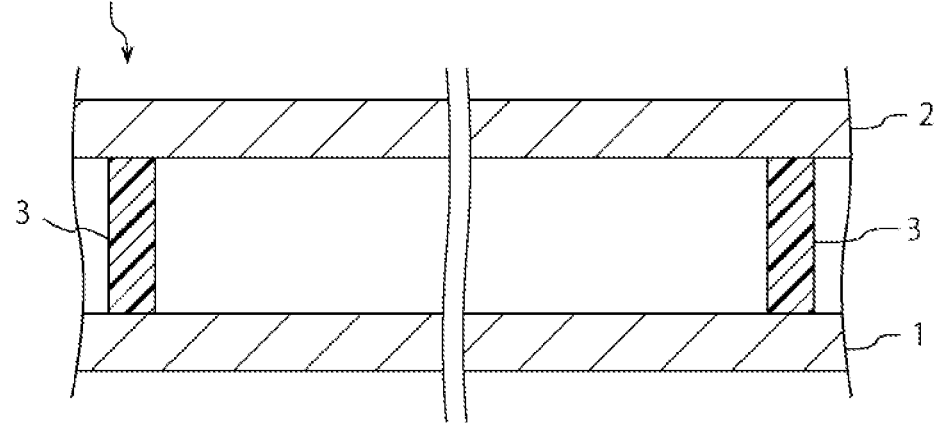
(f)

[FIG. 4]
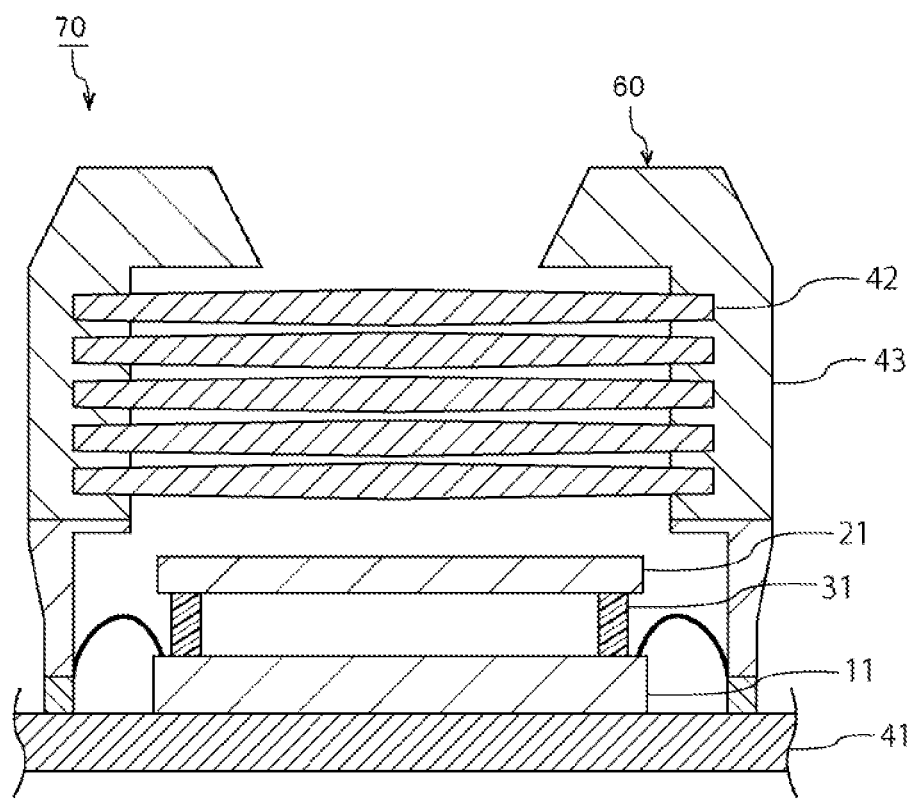

__US 12,528,956 B2__

INK-JET ADHESIVE, METHOD FOR PRODUCING ELECTRONIC COMPONENT, AND ELECTRONIC COMPONENT

TECHNICAL FIELD

The present invention relates to an ink-jet adhesive used by being applied via an ink-jet device. The present invention also relates to a method for producing an electronic component using the adhesive, and an electronic component.

BACKGROUND ART

In order to bond a semiconductor element and a substrate, an ink-jet adhesive applied via an ink-jet device may be used. In this method, the adhesive is applied onto a surface of the substrate via the ink-jet device, and then the adhesive is cured by light, heat, or the like to bond the semiconductor element and the substrate.

Patent Document 1 below discloses a liquid adhesive composition for a semiconductor containing a radiation polymerizable compound (A), a photoinitiator (B), and a thermosetting resin (C). In this adhesive composition, the photoinitiator (B) contains a compound having a molecular absorption coefficient of 100 ml/g·cm or more for light having a wavelength of 365 nm.

RELATED ART DOCUMENT

Patent Document

Patent Document 1: WO 2011/058998 A1

SUMMARY OF THE INVENTION

Problems to be Solved by the Invention

There is an increasing need for miniaturization in electronic devices such as mobile devices. For example, in a mobile device on which a camera is mounted, there is an increasing need for a thin camera module. The camera module usually includes a lens, an IR cut filter, and an image sensor in this order.

For example, the thickness of the camera module can be reduced if the image sensor and the IR cut filter can be bonded by applying the adhesive in a frame shape on a surface of the image sensor so as not to contaminate the sensor portion of the image sensor.

However, the present inventors have found that the IR cut filter, which is a transparent member, is fogged when the image sensor and the IR cut filter are bonded by applying a conventional ink-jet adhesive in the frame shape on the surface of the image sensor. Fogging on the IR cut filter degrades the quality of the camera.

The present inventors have found that the IR cut filter is fogged because an adhesive component volatilizes during the thermosetting of the adhesive, and the volatilized adhesive component adheres to the IR cut filter.

The purpose of the present invention is to provide an ink-jet adhesive that can suppress adhesion of the adhesive component to an unintended region of a transparent member when the transparent member is used as a member to be bonded. It is also an object of the present invention to provide a method for producing an electronic component using the adhesive, and an electronic component.

Means for Solving the Problems

According to a broad aspect of the present invention, there is provided an ink-jet adhesive (hereinafter sometimes abbreviated as "adhesive") which contains a photocurable compound having a (meth) acryloyl group or a vinyl group and having no cyclic ether group, and a photopolymerization initiator, the ink-jet adhesive contains or does not contain a thermosetting compound having no (meth) acryloyl group and having a cyclic ether group, and a content of the thermosetting compound is 5 wt % or less when the ink-jet adhesive contains the thermosetting compound.

In a specific aspect of the adhesive according to the present invention, the adhesive contains a photocurable and thermosetting compound having a (meth) acryloyl group and having a cyclic ether group, wherein a content of the photocurable and thermosetting compound is 20 wt % or more and 60 wt % or less.

In a specific aspect of the adhesive according to the present invention, when the ink-jet adhesive is irradiated with light having an integrated light amount of 1000 mJ/cm$^2$ so that illuminance at a wavelength of 365 nm is 100 mW/cm$^2$ to obtain a B-staged adhesive X, an elastic modulus of the B-staged adhesive X at 25° C. is 1×10$^2$ Pa or more and 4×10$^4$ Pa or less.

In a specific aspect of the adhesive according to the present invention, when the ink-jet adhesive is irradiated with light having an integrated light amount of 1000 mJ/cm$^2$ so that illuminance at a wavelength of 365 nm is 100 mW/cm$^2$ to obtain a B-staged adhesive X, an elastic modulus of the B-staged adhesive X at 25° C. is more than 4×10$^4$ Pa and 2×10$^9$ Pa or less.

In a specific aspect of the adhesive according to the present invention, when the ink-jet adhesive is irradiated with light having an integrated light amount of 20,000 mJ/cm$^2$ so that illuminance at a wavelength of 365 nm is 2000 mW/cm$^2$ to obtain a B-staged adhesive Y, a viscosity of the B-staged adhesive Y at 40° C. is 80 Pa·s or more and 8000 Pa·s or less.

In a specific aspect of the adhesive according to the present invention, the adhesive contains no thermosetting compound.

In a specific aspect of the adhesive according to the present invention, the adhesive contains the thermosetting compound, and the thermosetting compound is an epoxy compound having two or more epoxy groups.

In a specific aspect of the adhesive according to the present invention, the photocurable compound contains a first photocurable compound having one (meth) acryloyl group and a second photocurable compound having two or more (meth) acryloyl groups.

In a specific aspect of the adhesive according to the present invention, the second photocurable compound contains a photocurable compound having six or more (meth) acryloyl groups.

In a specific aspect of the adhesive according to the present invention, the adhesive contains a coloring material, wherein a transmittance of the adhesive is 10% or less.

In a specific aspect of the adhesive according to the present invention, the adhesive is an adhesive to be applied in a frame shape onto a surface of a first member.

In a specific aspect of the adhesive according to the present invention, the adhesive is an adhesive used for bonding a first member and a peripheral edge portion of a second member.

According to a broad aspect of the present invention, there is provided a method for producing an electronic component, the method including an applying step of applying the ink-jet adhesive described above onto a surface of a first member via an ink-jet device to form an adhesive layer; a photocuring step of advancing curing of the adhesive layer by light irradiation to form a B-staged adhesive layer; an arranging step of arranging a second member on a surface of the B-staged adhesive layer opposite to a first member side; and a thermosetting step of thermosetting the B-staged adhesive layer by heating, and in the arranging step, the second member is arranged on the surface of the B-staged adhesive layer having a frame shape.

In a specific aspect of the method for producing an electronic component according to the present invention, the first member is a semiconductor element, and the second member is a transparent member.

In a specific aspect of the method for producing an electronic component according to the present invention, the second member is a transparent glass member.

According to a broad aspect of the present invention, there is provided an electronic component including a first member, a second member, and a cured product layer of an adhesive bonding the first member and a peripheral edge portion of the second member, and the cured product layer of the adhesive is the cured product layer of the ink-jet adhesive described above.

According to a broad aspect of the present invention, there is provided an electronic component including a first member, a second member, and a cured product layer of an adhesive bonding the upper surface of the first member and the side surface or the lower surface of the second member, and the cured product layer of the adhesive is the cured product layer of the ink-jet adhesive described above, and the first member, the second member, and the cured product layer of the adhesive form an internal space.

In a specific aspect of the electronic component according to the present invention, the first member is a semiconductor element, and the second member is a transparent member.

In a specific aspect of the electronic component according to the present invention, the second member is a transparent glass member.

Effect of the Invention

The ink-jet adhesive according to the present invention contains a photocurable compound having a (meth) acryloyl group or a vinyl group and having no cyclic ether group, and a photopolymerization initiator. The ink-jet adhesive according to the present invention contains or does not contain a thermosetting compound having no (meth) acryloyl group and having a cyclic ether group, and the content of the thermosetting compound is 5 wt % or less when the ink-jet adhesive contains the thermosetting compound. Since the ink-jet adhesive according to the present invention is provided with the above-described configuration, it is possible to suppress adhesion of an adhesive component to an unintended region of a transparent member when the transparent member is used as a member to be bonded.

BRIEF DESCRIPTION OF DRAWINGS

FIG. 1(a) is a plan view schematically showing an electronic component obtained by using an ink-jet adhesive according to a first embodiment of the present invention, and FIG. 1(b) is a sectional view schematically showing the electronic component.

FIGS. 2(a) to 2(c) are sectional views for describing each step of the method for producing the electronic component shown in FIG. 1.

FIGS. 3(d) to 3(f) are sectional views for describing each step of the method for producing the electronic component shown in FIG. 1.

FIG. 4 is a sectional view schematically showing an electronic component obtained by using an ink-jet adhesive according to a second embodiment of the present invention.

MODE(S) FOR CARRYING OUT THE INVENTION

Hereinafter, the present invention will be described in detail.

(Ink-Jet Adhesive)

An ink-jet adhesive (hereinafter sometimes abbreviated as "adhesive") according to the present invention is applied via an ink-jet device. The adhesive according to the present invention is different from an adhesive applied via screen printing and different from an adhesive applied via a dispenser.

The adhesive according to the present invention contains a photocurable compound having a (meth) acryloyl group or a vinyl group and having no cyclic ether group, and a photopolymerization initiator. The adhesive according to the present invention contains or does not contain a thermosetting compound having no (meth) acryloyl group and having a cyclic ether group, and when the adhesive contains the thermosetting compound, the content of the thermosetting compound is 5 wt % or less.

In the present specification, the "photocurable compound having a (meth) acryloyl group or a vinyl group and having no cyclic ether group" may be referred to as "photocurable compound (A)".

In the present specification, the "thermosetting compound having no (meth) acryloyl group and having a cyclic ether group" may be referred to as "thermosetting compound (B)".

Therefore, the adhesive according to the present invention contains the photocurable compound (A) and the photopolymerization initiator. The adhesive according to the present invention contains or does not contain the thermosetting compound (B), and when the adhesive contains the thermosetting compound (B), the content of the thermosetting compound (B) is 5 wt % or less. In other words, the adhesive according to the present invention contains no thermosetting compound (B) or contains 5 wt % or less of the thermosetting compound (B).

Since the adhesive according to the present invention is provided with the above-described configuration, it is possible to suppress adhesion of an adhesive component to an unintended region of a transparent member when the transparent member is used as a member to be bonded. For example, when a first member (lower member) and a second member (upper member) that is the transparent member are bonded by the adhesive according to the present invention, it is possible to suppress adhesion of an adhesive component to an unintended region on the lower surface of the second member. Therefore, it is possible to suppress fogging on the transparent member in the obtained electronic component.

Since the adhesive according to the present invention is provided with the above-described configuration, it is possible to increase the bonding strength between the member to be bonded and a cured product layer of the adhesive.

The adhesive according to the present invention may be an adhesive for bonding a plurality of members to be bonded to each other. The adhesive according to the present invention may be an adhesive for bonding only a single member to be bonded. The portion to which the adhesive according to the present invention is applied is not particularly limited as long as it is on the surface of the member to be bonded. The adhesive according to the present invention may be applied to the upper surface, the lower surface, or the side surface of the member to be bonded.

The adhesive according to the present invention preferably contains a photocurable and thermosetting compound having a (meth) acryloyl group and having a cyclic ether group.

In the present specification, the "photocurable and thermosetting compound having a (meth) acryloyl group and having a cyclic ether group" may be referred to as "photocurable and thermosetting compound (C)".

Since the adhesive contains the photocurable compound (A) and the photopolymerization initiator, the adhesive is a photocurable ink-jet adhesive. The adhesive preferably has photocurable and thermosetting properties and is preferably a photocurable and thermosetting ink-jet adhesive. The adhesive is preferably used in such a manner of first advancing curing by light irradiation and then curing by heating.

Hereinafter, details of each component contained in the adhesive will be described. In the present specification, "(meth) acryloyl" means one or both of "acryloyl" and "methacryloyl", and "(meth) acrylate" means one or both of "acrylate" and "methacrylate". In the present specification, a $CH_2=C$ (H or $CH_3$) group of a (meth) acryloyl group is not included in the vinyl group.

<Photocurable Compound (A)>

The adhesive contains a photocurable compound (A). The photocurable compound (A) is a photocurable compound having a (meth) acryloyl group or a vinyl group and having no cyclic ether group. The photocurable compound (A) may have a (meth) acryloyl group, a vinyl group, or both a (meth) acryloyl group and a vinyl group. The (meth) acryloyl group and the vinyl group are photocurable functional groups. The photocurable compound (A) has no, for example, epoxy group (cyclic ether group). One kind of the photocurable compound (A) may be singly used, or two or more kinds thereof may be used in combination.

From the viewpoint of more effectively exhibiting the effect of the present invention and the viewpoint of forming the adhesive layer with high accuracy, the photocurable compound (A) preferably has a (meth) acryloyl group. The photocurable compound (A) is preferably a (meth) acrylate compound.

The photocurable compound (A) may contain a first photocurable compound having one (meth) acryloyl group, or may contain a second photocurable compound having two or more (meth) acryloyl groups. The first photocurable compound is a monofunctional (meth) acrylate compound. The second photocurable compound is a polyfunctional (meth) acrylate compound. One kind of each of the first photocurable compound and the second photocurable compound may be singly used, or two or more kinds thereof may be used in combination.

From the viewpoint of more effectively exhibiting the effect of the present invention, the photocurable compound (A) preferably contains a photocurable compound (second photocurable compound) having two or more (meth) acryloyl groups. Using the second photocurable compound as the photocurable compound (A) helps to form an adhesive layer even more accurately.

From the viewpoint of more effectively exhibiting the effect of the present invention, the photocurable compound (A) preferably contains the first photocurable compound and the second photocurable compound. Using the first photocurable compound and the second photocurable compound in combination as the photocurable compound (A) helps to form an adhesive layer even more accurately.

Examples of the first photocurable compound (monofunctional (meth) acrylate compound) include methyl (meth) acrylate, ethyl (meth) acrylate, n-propyl (meth) acrylate, i-propyl (meth) acrylate, n-butyl (meth) acrylate, i-butyl (meth) acrylate, sec-butyl (meth) acrylate, t-butyl (meth) acrylate, 2-hydroxyethyl (meth) acrylate, 2-hydroxypropyl (meth) acrylate, 3-hydroxypropyl (meth) acrylate, 2-hydroxybutyl (meth) acrylate, 3-hydroxybutyl (meth) acrylate, 4-hydroxybutyl (meth) acrylate, allyl (meth) acrylate, benzyl (meth) acrylate, cyclohexyl (meth) acrylate, phenyl (meth) acrylate, 2-methoxyethyl (meth) acrylate, 2-phenoxyethyl (meth) acrylate, methoxydiethylene glycol (meth) acrylate, methoxytriethylene glycol (meth) acrylate, methoxypropylene glycol (meth) acrylate, methoxydipropylene glycol (meth) acrylate, isodecyl (meth) acrylate, isononyl (meth) acrylate, isobornyl (meth) acrylate, dicyclopentadienyl (meth) acrylate, 2-hydroxy-3-phenoxypropyl (meth) acrylate, glycerol mono (meth) acrylate, 2-ethylhexyl (meth) acrylate, dihydroxycyclopentadienyl (meth) acrylate, dicyclopentenyl (meth) acrylate, dicyclopentenyloxyethyl (meth) acrylate, dicyclopentanyl (meth) acrylate, naphthyl (meth) acrylate, lauryl (meth) acrylate, dodecyl (meth) acrylate, and stearyl (meth) acrylate.

The second photocurable compound may be a difunctional (meth) acrylate compound, a trifunctional (meth) acrylate compound, or a tetrafunctional or higher (meth) acrylate compound. The photocurable compound (A) and the second photocurable compound may contain a bifunctional (meth) acrylate compound (photocurable compound having two (meth) acryloyl groups), or may contain a trifunctional (meth) acrylate compound (photocurable compound having three (meth) acryloyl groups). The photocurable compound (A) and the second photocurable compound may contain a tetrafunctional (meth) acrylate compound (photocurable compound having four (meth) acryloyl groups), or may contain a pentafunctional (meth) acrylate compound (photocurable compound having five (meth) acryloyl groups). The photocurable compound (A) and the second photocurable compound may contain a hexafunctional or higher (meth) acrylate compound, and may contain a hexafunctional (meth) acrylate compound (photocurable compound having six (meth) acryloyl groups). The second photocurable compound may contain a heptafunctional or higher functional (meth) acrylate compound. The number of (meth) acryloyl groups in the second photocurable compound may be 20 or less, 15 or less, or 10 or less.

Examples of the bifunctional (meth) acrylate compound include 1,4-butanediol di (meth) acrylate, 1,6-hexanediol di (meth) acrylate, 1,9-nonane di (meth) acrylate, 1,10-decanediol di (meth) acrylate, neopentyl glycol di (meth) acrylate, 2,4-dimethyl-1,5-pentanediol di (meth) acrylate, butylethylpropanediol di (meth) acrylate, ethoxylated cyclohexanemethanol di (meth) acrylate, polyethylene glycol di (meth) acrylate, oligoethylene glycol di (meth) acrylate, ethylene glycol di (meth) acrylate, 2-ethyl-2 butylbutanediol di (meth) acrylate, 2-ethyl-2 butylpropanediol di (meth) acrylate, tricyclodecane di (meth) acrylate, and, dipropylene glycol di (meth) acrylate.

Examples of the trifunctional (meth) acrylate compound include trimethylolpropane tri (meth) acrylate, trimethylolethane tri (meth) acrylate, alkylene oxide-modified tri (meth) acrylate of trimethylolpropane, pentaerythritol tri (meth) acrylate, dipentaerythritol tri (meth) acrylate, trimethylolpropane tri ((meth) acryloyloxypropyl) ether, isocyanuric acid alkylene oxide-modified tri (meth) acrylate, propionic acid dipentaerythritol tri (meth) acrylate, tri (meth) acryloyloxyethyl) isocyanurate, and sorbitol tri (meth) acrylate.

Examples of the tetrafunctional (meth) acrylate compound include pentaerythritol tetra (meth) acrylate, sorbitol tetra (meth) acrylate, ditrimethylolpropane tetra (meth) acrylate, and propionic acid dipentaerythritol tetra (meth) acrylate.

Examples of the pentafunctional (meth) acrylate compound include sorbitol penta (meth) acrylate and dipentaerythritol penta (meth) acrylate.

Examples of the hexafunctional (meth) acrylate compound include dipentaerythritol hexa (meth) acrylate, sorbitol hexa (meth) acrylate, and alkylene oxide-modified hexa (meth) acrylate of phosphazene.

Examples of the photocurable compound (A) having a vinyl group include vinyl ethers, ethylene derivatives, styrene, chloromethylstyrene, α-methylstyrene, maleic anhydride, dicyclopentadiene, N-vinylpyrrolidone, and N-vinylformamide.

From the viewpoint of more effectively exhibiting the effect of the present invention, the photocurable compound (A) preferably contains a photocurable compound having six or more (meth) acryloyl groups, and the second photocurable compound preferably contains a photocurable compound having six or more (meth) acryloyl groups. Using the photocurable compound having six or more (meth) acryloyl groups as the photocurable compound (A) helps to form an adhesive layer even more accurately.

When the photocurable compound (A) contains the photocurable compound having six or more (meth) acryloyl groups, the photocurable compound (A) may contain the first photocurable compound, may contain a photocurable compound having two or more and five or less (meth) acryloyl groups, or may contain the bifunctional (meth) acrylate compound. When the second photocurable compound contains the photocurable compound having six or more (meth) acryloyl groups, the second photocurable compound may contain a photocurable compound having two or more and five or less (meth) acryloyl groups, or may contain the bifunctional (meth) acrylate compound.

The content of the photocurable compound (A) in 100 wt % of the adhesive is preferably 5 wt % or more, more preferably 10 wt % or more, further preferably 15 wt % or more, and preferably 80 wt % or less, more preferably 70 wt % or less, further preferably 60 wt % or less. When the content of the photocurable compound (A) is not less than the lower limit and not more than the upper limit, the effect of the present invention can be more effectively exhibited.

The content of the first photocurable compound in 100 wt % of the adhesive is preferably 4 wt % or more, more preferably 10 wt % or more, further preferably 15 wt % or more, and preferably 80 wt % or less, more preferably 75 wt % or less, further preferably 70 wt % or less. When the content of the first photocurable compound is not less than the lower limit and not more than the upper limit, the effect of the present invention can be more effectively exhibited.

The content of the second photocurable compound in 100 wt % of the adhesive is preferably 4 wt % or more, more preferably 10 wt % or more, further preferably 15 wt % or more, and preferably 70 wt % or less, more preferably 65 wt % or less, further preferably 60 wt % or less. When the content of the second photocurable compound is not less than the lower limit and not more than the upper limit, the effect of the present invention can be more effectively exhibited.

The total content of the first photocurable compound and the second photocurable compound in 100 wt % of the adhesive is preferably 4 wt % or more, more preferably 10 wt % or more, and further preferably 15 wt % or more. The total content of the first photocurable compound and the second photocurable compound in 100 wt % of the adhesive is preferably 80 wt % or less, more preferably 75 wt % or less, still more preferably 70 wt % or less, further preferably 65 wt % or less, and particularly preferably 60 wt % or less. When the total content is not less than the lower limit and not more than the upper limit, the effect of the present invention can be more effectively exhibited.

The content of the photocurable compound having two or more and five or less (meth) acryloyl groups in 100 wt % of the adhesive is preferably 4 wt % or more, more preferably 6 wt % or more, further preferably 10 wt % or more, and preferably 50 wt % or less, more preferably 30 wt % or less, further preferably 20 wt % or less. When the content of the photocurable compound having two or more and five or less (meth) acryloyl groups is not less than the lower limit and not more than the upper limit, the effect of the present invention can be more effectively exhibited.

The content of the difunctional (meth) acrylate compound in 100 wt % of the adhesive is preferably 4 wt % or more, more preferably 6 wt % or more, further preferably 10 wt % or more, and preferably 50 wt % or less, more preferably 30 wt % or less, further preferably 20 wt % or less. When the content of the bifunctional (meth) acrylate compound is not less than the lower limit and not more than the upper limit, the effect of the present invention can be more effectively exhibited.

The content of the photocurable compound having six or more (meth) acryloyl groups in 100 wt % of the adhesive is preferably 4 wt % or more, more preferably 6 wt % or more, further preferably 10 wt % or more, and preferably 50 wt % or less, more preferably 30 wt % or less, further preferably 20 wt % or less. When the content of the photocurable compound having six or more (meth) acryloyl groups is not less than the lower limit and not more than the upper limit, the effect of the present invention can be more effectively exhibited.

The content of the hexafunctional (meth) acrylate compound in 100 wt % of the adhesive is preferably 4 wt % or more, more preferably 6 wt % or more, further preferably 10 wt % or more, and preferably 50 wt % or less, more preferably 30 wt % or less, further preferably 20 wt % or less. When the content of the hexafunctional (meth) acrylate compound is not less than the lower limit and not more than the upper limit, the effect of the present invention can be more effectively exhibited.

The content of the first photocurable compound in 100 wt % of the photocurable compound (A) is preferably 5 wt % or more, more preferably 10 wt % or more, further preferably 20 wt % or more, and preferably 95 wt % or less, more preferably 90 wt % or less, further preferably 80 wt % or less. When the content of the first photocurable compound is not less than the lower limit and not more than the upper limit, the effect of the present invention can be more effectively exhibited.

The content of the second photocurable compound in 100 wt % of the photocurable compound (A) is preferably 5 wt % or more, more preferably 10 wt % or more, further preferably 20 wt % or more, and preferably 95 wt % or less, more preferably 90 wt % or less, further preferably 80 wt % or less. When the content of the second photocurable compound is not less than the lower limit and not more than the upper limit, the effect of the present invention can be more effectively exhibited.

<Thermosetting Compound (B)>

The adhesive contains or does not contain 5 wt % or less of the thermosetting compound (B). The thermosetting compound (B) is a thermosetting compound having no (meth) acryloyl group and having a cyclic ether group. The cyclic ether group is a thermosetting functional group. One kind of the thermosetting compound (B) may be singly used, or two or more kinds thereof may be used in combination.

Conventional ink-jet adhesives contain a relatively large amount of the thermosetting compound (B). However, when a transparent member is bonded by an adhesive containing a relatively large amount of the thermosetting compound (B), an adhesive component (particularly, the thermosetting compound (B)) volatilizes during the thermosetting of the adhesive, and the adhesive component easily adheres to an unintended region of the transparent member. Therefore, the transparent member is easily fogged. On the other hand, in the adhesive according to the present invention, since the thermosetting compound (B) is not contained or contained only in a small amount (5 wt % or less), it is possible to suppress adhesion of the adhesive component to the unintended region of the transparent member. Therefore, it is possible to suppress fogging on the transparent member.

Examples of the cyclic ether group of the thermosetting compound (B) include an epoxy group. The thermosetting compound (B) may have only one kind of the cyclic ether group, or may have two or more kinds of the cyclic ether groups.

From the viewpoint of more effectively exhibiting the effect of the present invention and the viewpoint of forming the adhesive layer with high accuracy, the cyclic ether group of the thermosetting compound (B) is preferably an epoxy group. The thermosetting compound (B) preferably has an epoxy group. The thermosetting compound (B) is preferably an epoxy compound.

The thermosetting compound (B) may contain a first thermosetting compound having one cyclic ether group, or may contain a second thermosetting compound having two or more cyclic ether groups. The thermosetting compound (B) may contain an epoxy compound having one epoxy group (monofunctional epoxy compound) or may contain an epoxy compound having two or more epoxy groups (polyfunctional epoxy compound). One kind of each of the first thermosetting compound and the second thermosetting compound may be singly used, or two or more kinds thereof may be used in combination.

From the viewpoint of more effectively exhibiting the effect of the present invention, the thermosetting compound (B) preferably contains the epoxy compound having two or more epoxy groups, and is more preferably the epoxy compound having two or more epoxy groups.

From the viewpoint of further effectively exhibiting the effect of the present invention, the thermosetting compound (B) preferably contains an epoxy compound having two epoxy groups, and is more preferably the epoxy compound having two epoxy groups.

Examples of the epoxy compound include bisphenol A type epoxy compounds, bisphenol F type epoxy compounds, bisphenol S type epoxy compounds, phenol novolac type epoxy compounds, biphenyl type epoxy compounds, biphenyl novolac type epoxy compounds, biphenyl type epoxy compounds, naphthalene type epoxy compounds, fluorene type epoxy compounds, phenol aralkyl type epoxy compounds, naphthol aralkyl type epoxy compounds, dicyclopentadiene type epoxy compounds, anthracene type epoxy compounds, epoxy compounds having an adamantane skeleton, epoxy compounds having a tricyclodecane skeleton, naphthylene ether type epoxy compounds, and epoxy compounds having a triazine nucleus in the skeleton.

When the adhesive contains the thermosetting compound (B), the content of the thermosetting compound (B) in 100 wt % of the adhesive is 5 wt % or less. When the adhesive contains the thermosetting compound (B), the content of the thermosetting compound (B) in 100 wt % of the adhesive is preferably 4 wt % or less, more preferably 3 wt % or less, further preferably 2 wt % or less, and particularly preferably 1 wt % or less. From the viewpoint of more effectively exhibiting the effect of the present invention, the content of the thermosetting compound (B) is preferably as small as possible. Therefore, the adhesive most preferably contains no thermosetting compound (B). From the viewpoint of increasing the bonding strength between a member to be bonded and a cured product layer of the adhesive, the content of the thermosetting compound (B) in 100 wt % of the adhesive is preferably 0.5 wt % or more, more preferably 1 wt % or more, further preferably 2 wt % or more, and particularly preferably 3 wt % or more.

<Photocurable and Thermosetting Compound (C)>

The adhesive preferably contains a photocurable and thermosetting compound (C). The photocurable and thermosetting compound (C) is a photocurable and thermosetting compound having a (meth) acryloyl group and having a cyclic ether group. By using the photocurable and thermosetting compound (C), the adhesive layer can be formed with higher accuracy, the effect of the present invention can be more effectively exhibited, and the bonding strength between the member to be bonded and the cured product layer of the adhesive can be further increased. The (meth) acryloyl group is a photocurable functional group, and the cyclic ether group is a thermosetting functional group. One kind of the photocurable and thermosetting compound (C) may be singly used, or two or more kinds thereof may be used in combination.

The photocurable and thermosetting compound (C) may have one (meth) acryloyl group or two or more (meth) acryloyl groups.

Examples of the cyclic ether group of the photocurable and thermosetting compound (C) include an epoxy group. The photocurable and thermosetting compound (C) may have only one kind of the cyclic ether group, or may have two or more kinds of the cyclic ether groups.

From the viewpoint of forming the adhesive layer with higher accuracy, the viewpoint of more effectively exhibiting the effect of the present invention, and the viewpoint of further increasing the bonding strength between the member to be bonded and the cured product layer of the adhesive, the cyclic ether group of the photocurable and thermosetting compound (C) is preferably an epoxy group. The photocurable and thermosetting compound (C) preferably has a (meth) acryloyl group and an epoxy group.

The photocurable and thermosetting compound (C) may have one cyclic ether group, two cyclic ether groups, or two or more cyclic ether groups. The photocurable and thermosetting compound (C) may have one epoxy group, two epoxy groups, or two or more epoxy groups.

Examples of the photocurable and thermosetting compound (C) include glycidyl (meth) acrylate and 4-hydroxybutyl (meth) acrylate glycidyl ether.

The photocurable and thermosetting compound (C) preferably contains glycidyl (meth) acrylate or 4-hydroxybutyl (meth) acrylate glycidyl ether, and more preferably contains 4-hydroxybutyl (meth) acrylate glycidyl ether. The photocurable and thermosetting compound (C) further preferably contains 4-hydroxybutyl acrylate glycidyl ether. In this case, the adhesive layer can be formed with higher accuracy, the effect of the present invention can be more effectively exhibited, and the bonding strength between the member to be bonded and the cured product layer of the adhesive can be further increased.

The content of the photocurable and thermosetting compound (C) in 100 wt % of the adhesive is preferably 10 wt % or more, more preferably 20 wt % or more, further preferably 25 wt % or more, and preferably 60 wt % or less, more preferably 50 wt % or less, further preferably 45 wt % or less. When the content of the photocurable and thermosetting compound (C) is not less than the lower limit and not more than the upper limit, the adhesive layer can be formed with higher accuracy, the effect of the present invention can be more effectively exhibited, and the bonding strength between the member to be bonded and the cured product layer of the adhesive can be further increased.

The total content of the photocurable compound (A) and the photocurable and thermosetting compound (C) in 100 wt % of the adhesive is preferably 15 wt % or more, more preferably 25 wt % or more, further preferably 30 wt % or more, and preferably 85 wt % or less, more preferably 75 wt % or less, further preferably 70 wt % or less. When the total content is not less than the lower limit and not more than the upper limit, the adhesive layer can be formed with higher accuracy, the effect of the present invention can be more effectively exhibited, and the bonding strength between the member to be bonded and the cured product layer of the adhesive can be further increased.

The total content of the thermosetting compound (B) and the photocurable and thermosetting compound (C) in 100 wt % of the adhesive is preferably 10 wt % or more, more preferably 20 wt % or more, further preferably 25 wt % or more, and preferably 60 wt % or less, more preferably 55 wt % or less, further preferably 50 wt % or less. When the total content is not less than the lower limit and not more than the upper limit, the adhesive layer can be formed with higher accuracy, the effect of the present invention can be more effectively exhibited, and the bonding strength between the member to be bonded and the cured product layer of the adhesive can be further increased.

<Photopolymerization Initiator>

The adhesive contains a photopolymerization initiator. One kind of the photopolymerization initiator may be singly used, or two or more kinds thereof may be used in combination.

Examples of the photopolymerization initiator include a photoradical polymerization initiator and a photocationic polymerization initiator. The photopolymerization initiator is preferably the photoradical polymerization initiator.

The photoradical polymerization initiator is a compound for initiating a radical polymerization reaction by generating a radical upon light irradiation. Examples of the photoradical polymerization initiator include benzoin compounds such as benzoin, benzoin methyl ether, benzoin ethyl ether and benzoin isopropyl ether; alkylphenone compounds such as 2-hydroxy-2-methyl-1-phenyl-propane-1-one; acetophenone compounds such as acetophenone, 2,2-dimethoxy-2-phenylacetophenone, 2,2-diethoxy-2-phenylacetophenone, and 1,1-dichloroacetophenone; aminoacetophenone compounds such as 2-methyl-1-[4-(methylthio) phenyl]-2-morpholinopropane-1-one, 2-benzyl-2-dimethylamino-1-(4-morpholinophenyl)-butan-1-one, 2-benzyl-2-dimethylamino-1-(4-morpholinophenyl)-butanone-1, 2-(dimethylamino)-2-[(4-methylphenyl) methyl]-1-[4-(4-morpholinyl) phenyl]-1-butanone, and N,N-dimethylaminoacetophenone; anthraquinone compounds such as 2-methylanthraquinone, 2-ethylanthraquinone, and 2-t-butylanthraquinone; thioxanthone compounds such as 2,4-dimethylthioxanthone, 2,4-diethylthioxanthone, 2-chlorothioxanthone, and 2,4-diisopropylthioxanthone; ketal compounds such as acetophenone dimethyl ketal and benzyl dimethyl ketal; acylphosphine oxide compounds such as 2,4,6-trimethylbenzoyldiphenylphosphine oxide and bis(2,4,6-trimethylbenzoyl)-phenylphosphine oxide; oxime ester compounds such as 1,2-octanedione, 1-[4-(phenylthio)-2-(o-benzoyloxime)], ethanone, and 1-[9-ethyl-6-(2-methylbenzoyl)-9H-carbazole-3-yl]-1-(o-acetyloxime); titanocene compounds such as bis(cyclopentadienyl)-diphenyl-titanium, bis (cyclopentadienyl)-di-chloro-titanium, bis (cyclopentadienyl)-bis(2,3,4,5,6-pentafluorophenyl) titanium, and bis(cyclopentadienyl)-bis(2,6-difluoro-3-(pyrrole-1-yl) phenyl) titanium. One kind of the photoradical polymerization initiator may be singly used, or two or more kinds thereof may be used in combination.

A photopolymerization initiation aid may be used together with the photoradical polymerization initiator. Examples of the photopolymerization initiation aid include N,N-dimethylaminobenzoic acid ethyl ester, N,N-dimethylaminobenzoic acid isoamyl ester, pentyl-4-dimethylaminobenzoate, triethylamine, and triethanolamine. Photopolymerization initiation aids other than these may also be used. One kind of the photopolymerization initiation aid may be singly used, or two or more kinds thereof may be used in combination.

A titanocene compound such as CGI-784 (manufactured by Ciba Specialty Chemicals) having an absorption capacity in the visible light region may be used to promote photoreaction.

Examples of the photocationic polymerization initiator include sulfonium salts, iodonium salts, metallocene compounds, and benzoin tosylate. One kind of the photocationic polymerization initiator may be singly used, or two or more kinds thereof may be used in combination.

The content of the photopolymerization initiator in 100 wt % of the adhesive is preferably 0.1 wt % or more, more preferably 0.2 wt % or more, further preferably 0.5 wt % or more, and preferably 50 wt % or less, more preferably 45 wt % or less, still more preferably 40 wt % or less, further preferably 30 wt % or less, and particularly preferably 15 wt % or less.

<Thermosetting Agent>

The adhesive preferably contains a thermosetting agent. One kind of the thermosetting agent may be singly used, or two or more kinds thereof may be used in combination.

Examples of the thermosetting agent include an organic acid, an amine compound, an amide compound, a hydrazide compound, an imidazole compound, an imidazoline compound, a phenol compound, a urea compound, a polysulfide compound, and an acid anhydride. A modified polyamine compound such as an amine-epoxy adduct may be used as the thermosetting agent. Thermosetting agents other than these may be used as the thermosetting agent.

The amine compound means a compound having one or more primary to tertiary amino groups. Examples of the amine compound include an aliphatic polyamine, an alicyclic polyamine, an aromatic polyamine, a hydrazide, and a guanidine derivative. As the amine compound, an adduct such as an epoxy compound-added polyamine (a reaction product of an epoxy compound and a polyamine), a Michael-added polyamine (a reaction product of α,β-unsaturated ketone and a polyamine), a Mannich-added polyamine (a condensate of a polyamine, formalin, and phenol), a thiourea-added polyamine (a reaction product of thiourea and a polyamine), or a ketone-capped polyamine (a reaction product of a ketone compound and a polyamine [ketimine]) may be used.

Examples of the aliphatic polyamine include diethylenetriamine, triethylenetetramine, tetraethylenepentamine, and diethylaminopropylamine.

Examples of the alicyclic polyamine include mensendiamine, isophoronediamine, N-aminoethylpiperazine, 3,9-bis (3-aminopropyl)-2,4,8,10-tetraoxaspiro (5,5) undecane adduct, bis(4-amino-3-methylcyclohexyl) methane, and bis (4-aminocyclohexyl) methane.

Examples of the aromatic polyamine include m-phenylenediamine, p-phenylenediamine, o-xylenediamine, m-xylenediamine, p-xylenediamine, 4,4-diaminodiphenylmethane, 4,4-diaminodiphenylpropane, 4,4-diaminodiphenylsulfone, 4,4-diaminodicyclohexane, bis(4-aminophenyl) phenylmethane, 1,5-diaminonaphthalene, 1,1-bis(4-aminophenyl) cyclohexane, 2,2-bis[(4-aminophenoxy) phenyl] propane, bis[4-(4-aminophenoxy) phenyl] sulfone, 1,3-bis (4-aminophenoxy) benzene, 4,4-methylene-bis(2-chloroaniline), and 4,4-diaminodiphenylsulfone.

Examples of the hydrazide include carbodihydrazide, adipic acid dihydrazide, sebacic acid dihydrazide, dodecanedioic acid dihydrazide, and isophthalic acid dihydrazide.

Examples of the guanidine derivative include dicyandiamide, 1-o-tolyldiguanide, $\alpha$-2,5-dimethylguanide, $\alpha,\omega$-diphenyldiguanizide, $\alpha,\alpha$-bisguanylguanidinodiphenyl ether, p-chlorophenyldiguanide, $\alpha,\alpha$-hexamethylenebis[$\omega$-(p-chlorophenol)] diguanide, phenyldiguanide oxalate, acetylguanidine, and diethylcyanoacetylguanidine.

Examples of the phenol compound include a polyhydric phenol compound. Examples of the polyhydric phenol compound include phenol, cresol, ethylphenol, butylphenol, octylphenol, bisphenol A, tetrabrombisphenol A, bisphenol F, bisphenol S, 4,4'-biphenylphenol, a naphthalene skeleton-containing phenol novolac resin, a xylylene skeleton-containing phenol novolac resin, a dicyclopentadiene skeleton-containing phenol novolac resin, and a fluorene skeleton-containing phenol novolac resin.

Examples of the acid anhydride include phthalic anhydride, tetrahydrophthalic anhydride, hexahydrophthalic anhydride, methyltetrahydrophthalic anhydride, methylnadic anhydride, dodecylsuccinic anhydride, chlorendic anhydride, pyromellitic anhydride, benzophenone tetracarboxylic anhydride, methylcyclohexene tetracarboxylic anhydride, trimellitic anhydride, and poly(azelaic anhydride).

The content of the thermosetting agent in 100 wt % of the adhesive is preferably 1 wt % or more, more preferably 5 wt % or more, further preferably 7 wt % or more, and preferably 70 wt % or less, more preferably 60 wt % or less, still more preferably 50 wt % or less, further preferably 40 wt % or less, and particularly preferably 30 wt % or less.

<Curing Accelerator>

The adhesive may or may not contain a curing accelerator. One kind of the curing accelerator may be singly used, or two or more kinds thereof may be used in combination.

Examples of the curing accelerator include a tertiary amine, an imidazole, a quaternary ammonium salt, a quaternary phosphonium salt, an organometallic salt, a phosphorus compound, and a urea-based compound.

The content of the curing accelerator in 100 wt % of the adhesive is preferably 0.01 wt % or more, more preferably 0.05 wt % or more, and preferably 20 wt % or less, more preferably 10 wt % or less, further preferably 5 wt % or less.

<Coloring Material>

The adhesive may or may not contain a coloring material. Using the coloring material can reduce the transmittance of the adhesive layer and the cured product layer of the adhesive. Therefore, for example, when the adhesive is used for a camera module, the amount of light that passes through the cured product layer of the adhesive and reaches an image sensor can be reduced. One kind of the coloring material may be singly used, or two or more kinds thereof may be used in combination.

Examples of the coloring material include a dye and a pigment.

Examples of the dye include a pyrene-based dye, an aminoketone-based dye, an anthraquinone-based dye, and an azo-based dye. One kind of the dye may be singly used, or two or more kinds thereof may be used in combination.

Examples of the pyrene-based dye include Solvent Green5 (CAS79869-59-3) and Solvent Green7 (CAS6358-69-6).

Examples of the aminoketone-based dye include Solvent Yellow98 (CAS12671-74-8), Solvent Yellow85 (CAS12271-01-1) and Solvent Red179 (CAS8910-94-5), and Solvent Red135 (CAS71902-17-5).

Examples of the anthraquinone-based dye include Solvent Yellow163 (CAS13676091-0), Solvent Red207 (CAS15958-69-6), Disperse Red92 (CAS12236-11-2), Solvent Violet13 (CAS81-48-1), Disperse Violet31 (CAS6408-72-6), Solvent Blue97 (CAS61969-44-6), Solvent Blue45 (CAS37229-23-5), Solvent Blue104 (CAS116-75-6), and Disperse Blue214 (CAS104491-84-1).

Examples of the azo-based dye include Solvent Yellow30 (CAS3321-10-4), Solvent Red164 (CAS70956-30-8), and Disperse Blue146 (CAS88650-91-3).

Examples of the pigment include an organic pigment and an inorganic pigment. One kind of the pigment may be singly used, or two or more kinds thereof may be used in combination.

Examples of the organic pigment include a phthalocyanine compound, a quinacridone compound, an azo compound, a pentaphene compound, a perylene compound, an indole compound, and a dioxazine compound.

Examples of the inorganic pigment include carbon black, titanium dioxide, iron oxide, cadmium sulfide, calcium carbonate, barium carbonate, barium sulfate, clay, talc, and lead yellow.

The content of the coloring material in 100 wt % of the adhesive is preferably 0.01 wt % or more, more preferably 0.05 wt % or more, and preferably 30 wt % or less, more preferably 20 wt % or less, further preferably 10 wt % or less.

<Solvent>

The adhesive may or may not contain a solvent. One kind of the solvent may be singly used, or two or more kinds thereof may be used in combination.

Examples of the solvent include water and an organic solvent.

From the viewpoint of further improving residue removal, the solvent is preferably the organic solvent.

Examples of the organic solvent include alcohols such as ethanol, ketones such as acetone, methyl ethyl ketone and cyclohexanone, aromatic hydrocarbons such as toluene, xylene and tetramethylbenzene, glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and tripropylene glycol monomethyl ether, esters such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate and propylene carbonate, aliphatic hydrocarbons such as octane and decane, and petroleum-based solvents such as petroleum ether and naphtha.

From the viewpoint of further improving the thickness precision of the adhesive layer, the lower the solvent content in the above adhesive, the better. From the viewpoint of further improving the thickness precision of the adhesive layer, the adhesive preferably contains no solvent or contains 5 wt % or less of the solvent.

When the adhesive contains the solvent, the content of the solvent in 100 wt % of the adhesive is preferably 5 wt % or less, more preferably 1 wt % or less, and further preferably 0.5 wt % or less. The adhesive most preferably contains no solvent.

<Other Components>

The adhesive may contain components other than the above-described components. The other components are not particularly limited, and examples thereof include an adhesion aid such as a coupling agent, a filler other than the coloring material, a leveling agent, an antifoaming agent, a polymerization inhibitor, and the like.

(Other Details of Adhesive)

Since the adhesive is applied via an ink-jet device, the adhesive is generally liquid at 25° C. The viscosity of the adhesive at 25° C. and 10 rpm is preferably 3 mPa·s or more, more preferably 5 mPa·s or more, still more preferably 10 mPa·s or more, further preferably 160 mPa·s or more, and preferably 2000 mPa·s or less, more preferably 1600 mPa·s or less, further preferably 1500 mPa·s or less. From the viewpoint of further improving the thickness precision of the adhesive layer and further making voids more difficult to be generated in the adhesive layer, the viscosity of the adhesive at 25° C. and 10 rpm is particularly preferably 160 mPa·s or more and 1600 mPa·s or less.

The viscosity is measured at 25° C. using an E-type viscometer (for example, "TVE22 L" manufactured by Toki Sangyo Co., Ltd.) in accordance with JIS K 2283.

The ink-jet adhesive is irradiated with light having an integrated light amount of 1000 mJ/cm$^2$ so that illuminance at a wavelength of 365 nm is 100 mW/cm$^2$ to obtain a B-staged adhesive X. The elastic modulus of the B-staged adhesive X at 25° C. is preferably $1\times10^2$ Pa or more and preferably $2\times10^9$ Pa or less. When the elastic modulus of the B-staged adhesive X at 25° C. is not less than the lower limit, the bonding strength between the member to be bonded and the cured product layer of the adhesive can be further increased. When the elastic modulus of the B-staged adhesive X at 25° C. is not more than the upper limit, the cured product layer of the adhesive can be favorably formed.

The elastic modulus of the B-staged adhesive X at 25° C. is preferably $1\times10^2$ Pa or more, more preferably $5\times10^2$ Pa or more, further preferably $8\times10^2$ Pa or more, particularly preferably $1\times10^3$ Pa or more, preferably $4\times10^4$ Pa or less, more preferably $3\times10^4$ Pa or less, further preferably $2\times10^4$ Pa or less, and particularly preferably $1\times10^4$ Pa or less. When the elastic modulus of the B-staged adhesive X at 25° C. is not less than the lower limit, the bonding strength between the member to be bonded and the cured product layer of the adhesive can be further increased. When the elastic modulus of the B-staged adhesive X at 25° C. is not more than the upper limit, the cured product layer of the adhesive having a large aspect ratio (thickness/width) (for example, an aspect ratio of 0.3 or more and less than 1) can be favorably formed.

The elastic modulus of the B-staged adhesive X at 25° C. is preferably more than $4\times10^4$ Pa, more preferably $1\times10^5$ Pa or more, further preferably $1\times10^6$ Pa or more, and preferably $2\times10^9$ Pa or less, more preferably $1\times10^8$ Pa or less. When the elastic modulus of the B-staged adhesive X at 25° C. is not less than the lower limit, the bonding strength between the member to be bonded and the cured product layer of the adhesive can be further increased. When the elastic modulus of the B-staged adhesive X at 25° C. is not more than the upper limit, the cured product layer of the adhesive having a larger aspect ratio (thickness/width) (for example, an aspect ratio of 1 or more) can be favorably formed. The upper limit of the aspect ratio (thickness/width) is not particularly limited, but the aspect ratio (thickness/width) is preferably 5 or less because the electronic component can be downsized.

The illuminance can be measured using, for example, "UIT-201" manufactured by USHIO INC. Light irradiation for obtaining the B-staged adhesive X and the B-staged adhesive Y described later is preferably performed at 25° C.

The elastic modulus at 25° C. of the B-staged adhesive X means the elastic modulus of the B-staged adhesive X having a thickness of 20 μm.

The elastic modulus of the B-staged adhesive X at 25° C. is measured using a viscoelasticity measuring device (for example, "viscoelasticity measuring device ARES" manufactured by TA Instruments) under the conditions of 25° C., a measurement plate: a parallel plate having a diameter of 8 mm, and a frequency of 1 Hz. In the present specification, the elastic modulus means a storage elastic modulus (G').

The ink-jet adhesive is irradiated with light having an integrated light amount of 20,000 mJ/cm$^2$ so that illuminance at a wavelength of 365 nm is 2000 mW/cm$^2$ to obtain a B-staged adhesive Y. The viscosity of the B-staged adhesive Y at 40° C. is preferably 80 Pa·s or more and preferably $2\times10^8$ Pa or less. When the viscosity of the B-staged adhesive Y at 40° C. is not less than the lower limit, the cured product layer of the adhesive can be favorably formed. When the viscosity of the B-stage adhesive Y at 40° C. is not more than the upper limit, adhesiveness can be increased.

The viscosity of the B-staged adhesive Y at 40° C. is preferably 80 Pa·s or more and 8000 Pa·s or less. When the viscosity of the B-staged adhesive Y at 40° C. is not less than the lower limit, the cured product layer of the adhesive having a large aspect ratio (thickness/width) (for example, an aspect ratio of 0.3 or more and less than 1) can be favorably formed. When the viscosity of the B-stage adhesive Y at 40° C. is not more than the upper limit, adhesiveness can be increased. The viscosity of the B-staged adhesive Y at 40° C. is preferably 180 Pa·s or more, more preferably 210 Pa·s or more, and preferably 7100 Pa·s or less, more preferably 5500 Pa·s or less.

The viscosity of the B-staged adhesive Y at 40° C. is preferably more than 8000 Pa·s, more preferably $1\times10^4$ Pa or more, further preferably $1\times10^5$ Pa or more, and preferably $2\times10^8$ Pa or less, more preferably $2\times10^7$ Pa or less, further preferably $1\times10^6$ Pa or less. When the viscosity of the B-staged adhesive Y at 40° C. is not less than the lower limit, the cured product layer of the adhesive having a larger aspect ratio (thickness/width) (for example, an aspect ratio of 1 or more) can be favorably formed. When the viscosity of the B-stage adhesive Y at 40° C. is not more than the upper limit, adhesiveness can be increased. The upper limit of the aspect ratio (thickness/width) is not particularly limited, but the aspect ratio (thickness/width) is preferably 5 or less because the electronic component can be downsized.

More specifically, the B-staged adhesive Y is obtained by irradiating the adhesive with light having an integrated light amount of 20,000 mJ/cm$^2$ so that illuminance at a wavelength of 365 nm is 2000 mW/cm$^2$.

The viscosity of the B-staged adhesive Y at 40° C. is measured using a viscoelasticity measuring device (for example, "viscoelasticity measuring device ARES" manufactured by TA Instruments) under the conditions of 40° C., a measuring plate: a parallel plate having a diameter of 8 mm, and a frequency of 1 Hz. In the present specification, the viscosity of the B-staged adhesive Y means a complex viscosity ($\eta^*$).

The transmittance of the adhesive is preferably 30% or less, more preferably 10% or less, and further preferably 8% or less. When the adhesive in which the transmittance is the upper limit or less is used for a camera module, the amount of light that passes through the cured product layer of the adhesive and reaches an image sensor can be reduced. The transmittance of the adhesive can be adjusted, for example, depending on the use of the coloring material. Here, the transmittance of the adhesive may be 0% or more.

The adhesive is irradiated with light having a wavelength of 365 nm at 1000 mW for 1 second via a UV-LED to obtain a cured product Z of the adhesive. The transmittance of the obtained cured product Z of the adhesive is preferably 30% or less, more preferably 10% or less, and further preferably 8% or less. When the adhesive in which the transmittance of the cured product Z is the upper limit or less is used for a camera module, the amount of light that passes through the cured product layer of the adhesive and reaches an image sensor can be reduced. The transmittance of the cured product Z of the adhesive can be adjusted, for example, depending on the use of the coloring material. Here, the transmittance of the cured product Z of the adhesive may be 0% or more.

The transmittance of the adhesive and the transmittance of the cured product Z of the adhesive can be measured as follows.

The transmittance of the adhesive and the transmittance of the cured product Z of the adhesive mean the transmittance of the adhesive (adhesive layer) having a thickness of 100 μm and the transmittance of the cured product Z of the adhesive having a thickness of 100 μm, respectively. For the transmittance, visible light transmittance at a wavelength of 380 nm to 700 nm of the adhesive or the cured product Z of the adhesive is measured in accordance with JIS R 3211: 1998 using a spectrophotometer (for example, "U-4100" manufactured by Hitachi High-Tech Co., Ltd.).

The adhesive can be used to bond a first member and a second member. The second member is preferably a transparent member, and more preferably a transparent glass member.

The adhesive is preferably applied onto the surface of the first member. The adhesive is preferably an adhesive different from an adhesive applied to the entire surface (the entire first main surface) of the first member, and is preferably an adhesive different from an adhesive arranged on the entire surface (the entire first main surface) of the first member. The adhesive is preferably an adhesive applied to a portion of a first surface of the first member, and more preferably an adhesive applied to a peripheral edge portion of the first member. The adhesive is preferably an adhesive arranged on a portion of a first surface of the first member, and more preferably an adhesive arranged on a peripheral edge portion of the first member. The adhesive is preferably an adhesive used without being applied to a central portion of the first member. The adhesive is preferably an adhesive applied in a frame shape onto the surface of the first member, and is preferably an adhesive arranged in a frame shape onto the surface of the first member. The adhesive is preferably an adhesive used for forming a frame-shaped cured product layer of the adhesive (use of the adhesive for forming a frame-shaped cured product layer of the adhesive). An internal space is preferably present on the inner side of the frame-shaped cured product layer of the adhesive. The adhesive is preferably an adhesive used for bonding an upper surface of the first member and a side surface or a lower surface of the second member, and more preferably, it is an adhesive used for bonding the upper surface of the first member and the side surface of the second member. In this case, the adhesive may be an adhesive used for bonding the upper surface of the first member and the side surface and the upper surface of the second member. The first member, the second member, and the cured product layer of the adhesive preferably form an internal space.

Examples of the frame shape include a polygonal shape (for example, a square shape, a rectangular shape, and the like), a circular shape, an elliptical shape, and the like in plan view. The frame shape can be appropriately changed depending on the shape of the first member and the shape of the second member. The adhesive is preferably used for forming a partition wall. The adhesive is preferably an ink-jet and partition wall forming adhesive.

The adhesive is preferably an adhesive used for bonding the first member and a peripheral edge portion of the second member (use of the adhesive for bonding the first member and a peripheral edge portion of the second member). The adhesive is more preferably an adhesive used for bonding the first member and the peripheral edge portion of the second member without bonding the first member and a central portion of the second member.

Details of the first member and the second member will be described later.

(Method for Producing Electronic Component and Electronic Component)

A method for producing an electronic component according to the present invention includes the following steps (1) to (4): (1) an applying step of applying the adhesive described above onto the surface of the first member via the ink-jet device to form an adhesive layer; (2) a photocuring step of advancing curing of the adhesive layer by light irradiation to form a B-staged adhesive layer; (3) an arranging step of arranging the second member on a surface of the B-staged adhesive layer opposite to the first member side; (4) a thermosetting step of thermosetting the B-staged adhesive layer by heating.

An electronic component according to the present invention includes the first member, the second member, and the cured product layer of the adhesive bonding the first member and the second member. In the electronic component according to the present invention, the cured product layer of the adhesive is the cured product layer of the adhesive described above.

Hereinafter, specific embodiments of the present invention will be described with reference to the drawings. In the following drawings, the size, thickness, shape, and the like may be different from the actual size, thickness, shape, and the like for convenience of illustration.

FIG. 1(a) is a plan view schematically showing the electronic component obtained by using the ink-jet adhesive according to the first embodiment of the present invention, and FIG. 1(b) is a sectional view schematically showing the electronic component. FIG. 1(b) is a sectional view taken along line I-I of FIG. 1(a).

An electronic component 10 shown in FIG. 1 includes the first member 1, the second member 2, and the cured product layer 3 of the adhesive. In the electronic component 10, the first member 1 is a semiconductor element, and the second member 2 is a transparent glass member. The cured product layer 3 of the adhesive is a photocured and thermoset product layer of the adhesive described above.

The cured product layer 3 of the adhesive bonds the first member 1 and the peripheral edge portion of the second member 2. More specifically, the cured product layer 3 of the adhesive bonds the peripheral edge portion of the first member 1 and the peripheral edge portion of the second member 2.

The cured product layer 3 of the adhesive is not arranged on the central portion of the first member 1 and not on the central portion of the second member 2. An internal space is present on the inner side of the cured product layer 3 of the adhesive. The cured product layer 3 of the adhesive is arranged on a portion of the upper surface of the first member 1 and on a portion of the lower surface of the second member 2. The cured product layer 3 of the adhesive is frame-shaped. The cured product layer 3 of the adhesive does not reach the end of the first member 1 and does not reach the end of the second member 2. The electronic component 10 has a space surrounded by the first member 1, the second member 2, and the cured product layer 3 of the adhesive.

An example of a method for producing the electronic component shown in FIG. 1 will be described with reference to FIGS. 2(a) to 2(c) and FIGS. 3(d) to 3(f).

First, as shown in FIG. 2(a), the adhesive is applied onto the surface of the first member 1 via the ink-jet device to form the adhesive layer 3A (applying step). The adhesive is applied to the upper surface of the first member 1 to form the adhesive layer 3A. The adhesive is discharged from the discharge unit 51 of the ink-jet device.

Next, as shown in FIG. 2(b), the adhesive layer 3A is irradiated with light from a light irradiation unit 52 of the ink-jet device to advance the curing of the adhesive layer 3A, thereby forming the B-staged adhesive layer 3B (photocuring step). The B-staged adhesive layer 3B is a precured product layer of the adhesive.

In the method for producing the electronic component, after the adhesive is applied to a specific region, the entire applied adhesive may be irradiated with light to form the B-staged adhesive layer. In the method for producing the electronic component, every time a plurality of drops of the adhesive is applied, the applied adhesive may be irradiated with light to form the B-staged adhesive layer. In the method for producing the electronic component, every time one drop of the adhesive is applied, the applied adhesive may be irradiated with light to form the B-staged adhesive layer.

After the photocuring step, it is determined whether or not the applying step and the photocuring step are going to be repeated. When the applying step and the photocuring step are going to be repeated, the adhesive is applied to the surface of the formed B-staged adhesive layer opposite to the first member side.

FIGS. 2(c) and 3(d) are views showing a second applying step and a second photocuring step, respectively. As shown in FIG. 2(c), an adhesive is applied onto the surface of the B-staged adhesive layer 3B opposite to the first member 1 side via an ink-jet device to form the adhesive layer 3A on the surface of the B-staged adhesive layer 3B. Next, as shown in FIG. 3(d), the applied adhesive layer 3A is irradiated with light from the light irradiation unit 52 of the ink-jet device to form the B-staged adhesive layer 3B.

In FIGS. 2 and 3, the applying step and the photocuring step are performed twice in FIGS. 2(a) and 2(b) and FIGS. 2(c) and 3(d) in the thickness direction of the adhesive layer. By performing each of the applying step and the photocuring step a plurality of times in the thickness direction of the adhesive layer, the thickness of the B-staged adhesive layer can be increased, and the aspect ratio (thickness/width) of the B-staged adhesive layer can be increased. Each of the applying step and the photocuring step may be performed two or more times or three or more times.

The applying step and the photocuring step are repeated to form the frame-shaped B-staged adhesive layer 3B.

Next, as shown in FIG. 3(e), the second member 2 is arranged on the surface of the B-staged adhesive layer 3B opposite to the first member 1 side (arranging step). The second member 2 is arranged on the surface of the frame-shaped B-staged adhesive layer 3B. When the second member is arranged, pressure may be applied.

Next, as shown in FIG. 3(f), the B-staged adhesive layer 3B is thermoset by heating (thermosetting step). The B-staged adhesive layer 3B is thermoset by heating a laminated structure that is obtained in FIG. 3(e) and includes the first member 1, the second member 2, and the B-staged adhesive layer 3B. Thus, the cured product layer 3 of the adhesive is formed. The cured product layer 3 of the adhesive is a photocured and thermoset cured product layer of the adhesive.

In this way, the electronic component 10 shown in FIG. 1 can be obtained.

In the photocuring step, an ultraviolet ray is preferably irradiated. The illuminance and irradiation time of the ultraviolet ray in the photocuring step can be appropriately changed depending on the composition of the adhesive and the application thickness of the adhesive. The illuminance of the ultraviolet ray in the photocuring step may be, for example, 1000 mW/cm$^2$ or more, 5000 mW/cm$^2$ or more, 10,000 mW/cm$^2$ or less, or 8000 mW/cm$^2$ or less. The irradiation time of the ultraviolet ray in the photocuring step may be, for example, 0.01 seconds or more, 0.1 seconds or more, 400 seconds or less, or 100 seconds or less.

In the arranging step, the second member is preferably arranged on the surface of the frame-shaped B-staged adhesive layer. In the arranging step, the surface of the frame-shaped B-staged adhesive layer is preferably adhered to the peripheral edge portion of the second member.

The applying step and the photocuring step may be repeated to form the B-staged adhesive layer in contact with the side surface of the second member.

The thermosetting step is preferably performed after the arranging step.

The heating temperature and heating time in the thermosetting step can be appropriately changed depending on the composition of the adhesive and the thickness of the B-staged adhesive layer. The heating temperature in the thermosetting step may be, for example, 100° C. or higher, 120° C. or higher, 250° C. or lower, or 200° C. or lower. The heating time in the thermosetting step may be, for example, 5 minutes or more, 30 minutes or more, 600 minutes or less, or 300 minutes or less.

The electronic component according to the present invention preferably includes the first member, the second member, and the cured product layer of the adhesive bonding the first member and the peripheral edge portion of the second member. In the electronic component, the cured product layer of the adhesive is preferably arranged in a frame shape. In the electronic component, the cured product layer of the adhesive is preferably not arranged on the central portion of the first member, and not on the central portion of the second member. In the electronic component, an internal space is preferably formed by the first member, the second member, and the cured product layer of the adhesive.

The electronic component according to the present invention preferably includes the first member, the second member, and the cured product layer of the adhesive bonding the upper surface of the first member and the side surface or the lower surface of the second member. In the electronic component, an internal space is preferably formed by the first member, the second member, and the cured product layer of the adhesive.

The width, thickness, and the like of the cured product layer of the adhesive can be appropriately changed.

The width of the cured product layer of the adhesive may be 30 μm or more, 50 μm or more, 70 μm or more, 1000 μm or less, 800 μm or less, or 700 μm or less.

The thickness of the cured product layer of the adhesive may be 1 μm or more, 30 μm or more, 50 μm or more, 1000 μm or less, 800 μm or less, or 700 μm or less.

The aspect ratio (ratio of thickness to width (thickness/width)) of the cured product layer of the adhesive is preferably 0.3 or more, more preferably 1 or more, further preferably 5 or more, particularly preferably 8 or more, and further preferably 10 or more. The aspect ratio (ratio of thickness to width (thickness/width)) of the cured product layer of the adhesive may be 100 or less, 50 or less, 25 or less, 15 or less, or less than 1.

The first member may be a transparent member or may not be a transparent member. Examples of the first member include a circuit board, a semiconductor element, and a silicon substrate. Examples of the semiconductor element include an image sensor. Examples of the image sensor include a CMOS image sensor.

The second member may be a transparent member or may not be a transparent member. The second member is preferably a transparent member, and more preferably a transparent glass member. Examples of the second member that is a transparent member include an IR cut filter such as an IR cut glass, a condensing glass, and a light diffusing glass. Examples of the second member include a semiconductor element and a silicon substrate. Examples of the semiconductor element include a communication filter.

FIG. 4 is a sectional view schematically showing the electronic component obtained by using the ink-jet adhesive according to the second embodiment of the present invention. FIG. 4 is a sectional view schematically showing the electronic component including a camera module.

The electronic component 70 shown in FIG. 4 includes the camera module 60. The camera module 60 includes a lens 42, an IR cut filter 21, and an image sensor 11. The camera module 60 includes five lenses 42. The lens 42 is held by a lens holding member 43. The IR cut filter 21 is IR cut glass and is a transparent glass member. The image sensor 11 is a CMOS image sensor. The image sensor 11 is arranged on the surface of the circuit board 41.

The IR cut filter 21 and the image sensor 11 are bonded by a cured product layer 31 of an adhesive. The cured product layer 31 of the adhesive is the cured product layer of the adhesive described above. The cured product layer 31 of the adhesive is arranged in a frame shape on the surface of the image sensor 11 and the surface of the IR cut filter 21. The cured product layer 31 of the adhesive is not arranged on the sensor portion existing on the central portion of image sensor 11. The image sensor 11 and a peripheral edge portion of the IR cut filter 21 are bonded by the cured product layer 31 of the adhesive.

In a conventional camera module, the IR cut filter is held by an IR cut filter holding member. In the conventional camera module, the IR cut filter and the image sensor are not bonded by an adhesive. Therefore, in the conventional camera module, the distance between the IR cut filter and the image sensor is relatively long. On the other hand, in the present invention, since the IR cut filter and the image sensor can be bonded by a specific adhesive, the distance between the IR cut filter and the image sensor can be shortened, and as a result, the thickness of the camera module can be reduced.

Note that, when the camera module as shown in FIG. 4 is manufactured by using the conventional adhesive, an adhesive component may adhere to an unintended portion of the IR cut filter at the time of manufacturing, and fogging may occur on the IR cut filter. Therefore, the performance of the camera is deteriorated. On the other hand, in the present invention, since the specific adhesive is used, adhesion of the adhesive component to the unintended portion of the IR cut filter can be suppressed, and the IR cut filter is less likely to be fogged.

Hereinafter, the present invention will be described in more detail with reference to examples. The present invention is not limited only to the following examples.

The following materials are prepared.

(Photocurable Compound (A))
  (1) Monofunctional (meth) acrylate compound: 2-ethylhexyl acrylate ("AEH" manufactured by Nippon Shokubai Co., Ltd.)
  (2) Bifunctional (meth) acrylate compound 1: polyester-based urethane acrylate ("UA4400" manufactured by Shin Nakamura Chemical Co., Ltd.)
  (3) Bifunctional (meth) acrylate compound 2: tricyclodecane dimethanol diacrylate ("IRR214K" manufactured by Daicel-Allnex Ltd.)
  (4) Hexafunctional (meth) acrylate compound: dipentaerythritol hexaacrylate ("DPHA" manufactured by Daicel-Allnex Ltd.)

(Photopolymerization Initiator)
  (5) Photopolymerization initiator: 2-benzyl-2 dimethylamino-1-(4-morpholinophenyl)-butanone-1 ("IRGACURE369" manufactured by BASF)

(Thermosetting Compound (B))
  (6) Bifunctional epoxy compound 1: bisphenol A-type epoxy compound ("YD127" manufactured by Nippon Steel & Sumikin Chemical Co., Ltd.)
  (7) Bifunctional epoxy compound 2: glycidyl amine epoxy compound ("JER630" manufactured by Mitsubishi Chemical Corporation)

(Photocurable and Thermosetting Compound (C))
  (8) Photocurable and thermosetting compound: 4-hydroxybutyl (meth) acrylate glycidyl ether ("4HBAGE" manufactured by Nippon Kasei Chemical Co., Ltd.)

(Thermosetting Agent)
  (9) Thermosetting agent: acid anhydride having terpene skeleton ("YH306" manufactured by Mitsubishi Chemical Corporation)

(Curing Accelerator)
  (10) Curing accelerator: DBU-octylate ("UCAT SA-102" manufactured by San-Apro Ltd.)

(Coloring Material)
  (11) Coloring material: azo-based complex dye ("VALIFAST BLACK 3820" manufactured by Orient Chemical Industries Co., Ltd.)

Examples 1 to 21 and Comparative Examples 1 to 3

The components shown in Tables 1 to 4 are blended in the blending amounts shown in Tables 1 to 4 and mixed uniformly to obtain an adhesive.

(Evaluation)

(1) Elastic Modulus of B-Staged Adhesive X at 25° C.

The obtained adhesive is applied onto a substrate with a spin coater so as to have a thickness of 20 μm. The applied adhesive is irradiated with light at 25° C. for 10 seconds using an exposure device (ultra-high pressure mercury lamp, "JL-4300-3" manufactured by ORC MANUFACTURING CO., LTD.) adjusted so that illuminance at 365 nm measured by an illuminometer ("UIT-201" manufactured by USHIO INC.) is 100 mW/cm$^2$ (integrated light amount: 1000 mJ/cm$^2$). The elastic modulus of the obtained B-staged adhesive X having a thickness of 20 μm is measured using a "viscoelasticity measuring device ARES" manufactured by TA Instruments under the conditions of 25° C., a measurement plate: a parallel plate having a diameter of 8 mm, and a frequency of 1 Hz.

(2) Viscosity of B-Staged Adhesive Y at 40° C.

The obtained adhesive is irradiated with light at 25° C. for 10 seconds using an exposure device (ultra-high pressure mercury lamp, "JL-4300-3" manufactured by ORC MANUFACTURING CO., LTD.) adjusted so that illuminance at a wavelength of 365 nm measured by an illuminometer ("UIT-201" manufactured by USHIO INC.) is 2000 mW/cm$^2$ (integrated light amount: 20,000 mJ/cm$^2$). The viscosity of the obtained B-staged adhesive Y at 40° C. is measured using a viscoelasticity measuring device ("viscoelasticity measuring device ARES" manufactured by TA Instruments) under the conditions of 40° C., a measurement plate: a parallel plate having a diameter of 8 mm, and a frequency of 1 Hz.

(3) Glass Transition Temperature of Ink-Jet Adhesive

The obtained adhesive is applied onto a light peeling substrate with a spin coater so as to have a thickness of 5 μm. The applied adhesive is irradiated with light at 25° C. on a stage moving at a speed of 200 mm/sec using an exposure device adjusted so that illuminance at 365 nm measured by an illuminometer ("UIT-201" manufactured by USHIO INC.) is 5000 mW/cm$^2$. After irradiation with light, the light-irradiated adhesive is heated in an oven at 170° C. for 1 hour. After the heating, the heated adhesive is cut into a width of 5 mm×a length of 30 mm to prepare a sample. The glass transition temperature of the prepared sample is measured using a dynamic viscoelasticity measuring device ("DVA-200" manufactured by IT Measurement Control Co., Ltd.). The setting conditions of the device are as follows.

(Measurement Conditions of Glass Transition Temperature)
  Variation: Tensile mode
  Measurement temperature: −100° C. to 250° C.
  Heating rate: 5° C./min
  Measurement frequency: 10 Hz
  Strain: 0.1%

(4) Adhesion of Adhesive Component to Unintended Region of Transparent Glass Member (Fogging on Transparent Glass Member)

A silicon wafer is prepared as the first member. An IR cut filter (transparent glass member) is prepared as the second member. The obtained adhesive is applied onto the surface of the first member via an ink-jet device while being circulated at 40° C. to form an adhesive layer (applying step). Subsequently, the adhesive layer is irradiated with light under the conditions of an illuminance of 100 mW/cm$^2$ and an irradiation time of 0.1 seconds using a UV-LED lamp having a main wavelength of 365 nm to form the B-staged adhesive layer (light irradiating step). The applying step and the light irradiating step are repeated to form the B-staged adhesive layer having a length of 5 mm×a width of 5 mm×a thickness of 150 μm and a width of 150 μm on the surface of the first member.

Next, the second member is placed on the surface of the B-staged adhesive layer, and pressed at 40° C. and 0.1 MPa for 1 second using a die bonding device to arrange the second member on the surface of the B-staged adhesive layer (arranging step). This structure is then placed in an oven at 170° C. and heated for 1 hour to thermoset the B-staged adhesive layer (thermosetting step). In this way, a component for evaluation is obtained. The surface (glass surface) of the second member in the obtained evaluation component is observed at a magnification of 100 times using a stereoscopic microscope ("MM-800" manufactured by Nicon Solutions). The area ratio of the fogged portion in 100% of the area of the glass surface excluding the portion where the cured product layer of the adhesive is arranged is determined and evaluated according to the following criteria. Smaller area ratio of the fogged portion is more effective in suppressing adhesion of the adhesive component to the unintended region of the second member.

<Determination Criteria for Fogging on Transparent Glass Member>
  ○○: The fogged area is less than 1%.
  ○: The fogged area is 1% or more and less than 5%.
  X: The fogged area is 5% or more and less than 30%.
  XX: The fogged area is 30% or more.

(5) Bonding Strength Between Transparent Glass Member and Cured Product Layer of Adhesive (Die Shear Strength)

The obtained adhesive is applied onto a surface of the silicon wafer using a spin coater so as to have a thickness of 20 μm. The formed adhesive layer having a thickness of 20 μm is irradiated with light at 25° C. for 10 seconds using an exposure device (ultra-high pressure mercury lamp, "JL-4300-3" manufactured by ORC MANUFACTURING CO., LTD.) adjusted so that illuminance at 365 nm measured with an illuminometer ("UIT-201" manufactured by USHIO INC.) is 100 mW/cm$^2$ (integrated light amount: 1000 mJ/cm$^2$). The B-staged adhesive layer is thus formed on the surface of the silicon wafer. Next, a silicon bare chip resembling a semiconductor chip (3 mm long×3 mm wide× 750 μm thick) is placed on the surface of the B-staged adhesive layer, and the silicon bare chip is arranged on the surface of the B-staged adhesive layer by being pressurized at 40° C. and 0.1 MPa for 1 second using a die bonding device. This structure is then placed in an oven at 170° C. and heated for 1 hour to thermoset the B-staged adhesive layer. In this way, a component for measuring die shear strength is obtained. The die shear strength of the component for measuring die shear strength is measured under the condition of a test temperature of 80° C. using a die shear strength measuring device ("Dage Series 4000" manufactured by Dage).

<Determination Criteria for Die Shear Strength>
  ○○: Die shear strength is 15 N or more.
  ○: Die share strength is 5 N or more and less than 15 N.
  X: Die shear strength is less than 5 N.

(6) Mold Resistance (Transfer Mold)

A glass epoxy substrate on which a Si chip (1×2 mm, height: 300 μm) is mounted by solder (height: 80 μm) is prepared. The obtained adhesive is applied to the periphery of the Si chip on the glass epoxy substrate to a width of 200 μm and a height of 300 μm via the ink-jet device. The applied adhesive is irradiated with light on a stage moving at a speed of 200 mm/sec using an exposure device adjusted so that illuminance at 365 nm is 5000 mW/cm². After irradiation with light, the glass epoxy substrate having a light-irradiated adhesive is heated in an oven at 170° C. for 1 hour. After the heating, the glass epoxy substrate having the heated adhesive is resin-sealed using "YPS2060M" manufactured by TOWA under the following conditions to obtain a resin-sealed glass epoxy substrate.
(Conditions for Resin Sealing)
 Resin: "CV8410V" manufactured by Panasonic Corporation
 Molding temperature: 175° C.
 Curing time: 120 seconds
 Transfer load: 70 kgf/cm²

The obtained resin-sealed glass epoxy substrate is removed by polishing, and the presence or absence of mold resin intrusion into the lower portion of the Si chip is confirmed. Although resin intrusion may occur, it is preferable that resin intrusion does not occur.
<Determination Criteria for Mold Resistance>
 ○: No resin intrusion
 -: Resin intrusion (6) Long-Term Reliability (High Temperature and High Humidity Test)

A glass epoxy substrate on which a Si chip (1×2 mm, height: 300 μm) is mounted by solder (height: 80 μm) is prepared. The obtained adhesive is applied to the periphery of the Si chip on the glass epoxy substrate to a width of 200 μm and a height of 300 μm via the ink-jet device. The applied adhesive is irradiated with light on a stage moving at a speed of 200 mm/sec using an exposure device adjusted so that illuminance at 365 nm is 5000 mW/cm². After irradiation with light, the glass epoxy substrate having a light-irradiated adhesive is heated in an oven at 170° C. for 1 hour. After the heating, the glass epoxy substrate having the heated adhesive is resin-sealed using "YPS2060M" manufactured by TOWA under the following conditions to obtain a resin-sealed glass epoxy substrate.
(Conditions for Resin Sealing)
 Resin: "CV8410V" manufactured by Panasonic Corporation
 Molding temperature: 175° C.
 Curing time: 120 seconds
 Transfer load: 70 kgf/cm²

The obtained resin-sealed glass epoxy substrate is left at 85° C. and 85 RH % humidity for 168 hours to absorb moisture. Thereafter, the obtained resin-sealed glass epoxy substrate is passed through a solder reflow furnace (preheating at 150° C. for 100 seconds, reflowing [maximum temperature 260° C.]) for five cycles. Thereafter, the resin-sealed glass epoxy substrate is subjected to a cold/heat cycle reliability test using a liquid bath thermal shock tester ("TSB-51" manufactured by ESPEC), in which one cycle consists of holding the resin-sealed glass epoxy substrate at −55° C. for 5 minutes, and then raising the temperature to 150° C., and holding the substrate at 150° C. for 5 minutes, and then lowering the temperature to −50° C. After 250 cycles, the resin-sealed glass epoxy substrate is taken out, the resin-sealed glass epoxy substrate is removed by polishing, and the presence or absence of mold resin intrusion into the lower portion of the Si chip is confirmed. Although resin intrusion may occur, it is preferable that resin intrusion does not occur.
<Determination Criteria for Long-Term Reliability>
 ○: No resin intrusion
 -: Resin intrusion The composition and results are shown in Tables 1 to 4 below.

TABLE 1

| | | | Example 1 | Example 2 | Example 3 | Example 4 | Example 5 | Example 6 |
|---|---|---|---|---|---|---|---|---|
| (A) Photocurable compound | (1) Monofunctional (meth) acrylate compound | wt % | 30 | 50 | 42 | 41 | 40.5 | 40 |
| | (2) Bifunctional (meth) acrylate compound 1 | wt % | 4 | 4 | 4 | 4 | 4 | 4 |
| | (3) Bifunctional (meth) acrylate compound 2 | wt % | | | | | | |
| | (4) Hexafunctional (meth) acrylate compound | wt % | | | | | | |
| Photopolymerization initiator | (5) Photopolymerization initiator | wt % | 7 | 7 | 7 | 7 | 7 | 7 |
| (B) Thermosetting compound | (6) Difunctional epoxy compound 1 | wt % | | | 3 | 4 | 4.5 | 5 |
| | (7) Difunctional epoxy compound 2 | wt % | | | | | | |
| (C) Photocurable and thermosetting compound | (8) Photocurable and thermosetting compound | wt % | 42 | 28 | 30 | 30 | 30 | 30 |
| Thermosetting agent | (9) Thermosetting agent | wt % | 16 | 10 | 13 | 13 | 13 | 13 |
| Curing accelerator | (10) Curing accelerator | wt % | 1 | 1 | 1 | 1 | 1 | 1 |
| Coloring material | (11) Coloring material | wt % | | | | | | |
| Total | | wt % | 100.0 | 100.0 | 100.0 | 100.8 | 300.0 | 300.0 |
| Elastic modulus of B-staged adhesive X at 25° C. | | Pa | 1,500 | 900 | 500 | 600 | 600 | 600 |
| Viscosity of B-staged adhesive Y at 40° C. | | Pa·s | 180 | 150 | 160 | 160 | 160 | 160 |
| Glass transition temperature (Tg) | | ° C. | 3 | 2 | 5 | 5 | 5 | 5 |
| Fogging on transparent glass member | | % | <1 | <1 | <1 | <1 | 3 | 4 |
| | | Determination | ○○ | ○○ | ○○ | ○○ | ○ | ○ |
| Bonding strength between transparent glass member and cured product layer of adhesive (die shear strength) | | N | 20.84 | 20.10 | 21.48 | 21.86 | 22.13 | 22.68 |
| | | Determination | ○○ | ○○ | ○○ | ○○ | ○○ | ○○ |
| Mold resistance (transfer mold) | | | — | — | — | — | — | — |
| Long-term reliability (high temperature and high humidity test) | | | — | — | — | — | — | — |

TABLE 2

| | | | Example 7 | Example 8 | Example 9 | Example 10 | Example 11 | Example 12 |
|---|---|---|---|---|---|---|---|---|
| (A) Photocurable compound | (1) Monofunctional (meth) acrylate compound | wt % | 4 | 70 | 29 | 27 | 20 | |
| | (2) Bifunctional (meth) acrylate compound 1 | wt % | 50 | 4 | 4 | 4 | 4 | 10 |
| | (3) Bifunctional (meth) acrylate compound 2 | wt % | | | | | | |
| | (4) Hexafunctional (meth) acrylate compound | wt % | | | | | | |
| Photopolymerization initiator | (5) Photopolymerization initiator | wt % | 7 | 7 | 7 | 7 | 7 | 7 |
| (B) Thermosetting compound | (6) Difunctional epoxy compound 1 | wt % | | | | | | |
| | (7) Difunctional epoxy compound 2 | wt % | | | | | | |
| (C) Photocurable and thermosetting compound | (8) Photocurable and thermosetting compound | wt % | 28 | 10 | 42 | 42 | 42 | 60 |
| Thermosetting agent | (9) Thermosetting agent | wt % | 10 | 8 | 16 | 16 | 16 | 18 |
| Curing accelerator | (10) Curing accelerator | wt % | 1 | 1 | 1 | 1 | 1 | 1 |
| Coloring material | (11) Coloring material | wt % | | | 1 | 3 | 10 | |
| Total | | wt % | 100.0 | 100.0 | 100.0 | 100.0 | 100.0 | 300.0 |
| Elastic modulus of B-staged adhesive X at 25° C. | | Pa | 15,000 | 100 | 1,600 | 1,800 | 2,100 | 6,000 |
| Viscosity of B-staged adhesive Y at 40° C. | | Pa·s | 5,500 | 80 | 180 | 190 | 210 | 2,000 |
| Glass transition temperature (Tg) | | ° C. | 102 | 1 | 3 | 3 | 3 | 75 |
| Fogging on transparent glass member | | % | <1 | <1 | <1 | <1 | <1 | <1 |
| | | Determination | ○○ | ○○ | ○○ | ○○ | ○○ | ○○ |
| Bonding strength between transparent glass member and cured product layer of adhesive (die shear strength) | | N | 20.10 | 5.64 | 21.32 | 22.01 | 21.88 | 22.34 |
| | | Determination | ○○ | ○ | ○○ | ○○ | ○○ | ○○ |
| Mold resistance (transfer mold) | | | — | — | — | — | — | ○ |
| Long-term reliability (high temperature and high humidity test) | | | — | — | — | — | — | ○ |

TABLE 3

| | | | Example 13 | Example 14 | Example 15 | Example 16 | Example 17 | Example 18 |
|---|---|---|---|---|---|---|---|---|
| (A) Photocurable compound | (1) Monofunctional (meth) acrylate compound | wt % | 10 | 5 | 4 | 60 | 18 | 50 |
| | (2) Bifunctional (meth) acrylate compound 1 | wt % | 4 | | | 4 | 6 | 5 |
| | (3) Bifunctional (meth) acrylate compound 2 | wt % | | | 26 | | | 10 |
| | (4) Hexafunctional (meth) acrylate compound | wt % | | | 20 | | 10 | |
| Photopolymerization initiator | (5) Photopolymerization initiator | wt % | 7 | 2 | 10 | 6 | 17 | 5 |
| (B) Thermosetting compound | (6) Difunctional epoxy compound 1 | wt % | | | | | | |
| | (7) Difunctional epoxy compound 2 | wt % | | | | | | |
| (C) Photocurable and thermosetting compound | (8) Photocurable and thermosetting compound | wt % | 60 | 71 | 29 | 20 | 40 | 10 |
| Thermosetting agent | (9) Thermosetting agent | wt % | 18 | 21 | 11 | 7 | 8 | 20 |
| Curing accelerator | (10) Curing accelerator | wt % | 1 | 1 | | 1 | 1 | |
| Coloring material | (11) Coloring material | wt % | | | | | | |
| Total | | wt % | 100.0 | 100.0 | 100.0 | 100.0 | 100.0 | 100.0 |
| Elastic modulus of B-staged adhesive X at 25° C. | | Pa | 1200 | 1000 | 55,000,000 | 110 | 18,000,000 | 18,000,000 |
| Viscosity of B-staged adhesive Y at 40° C. | | Pa·s | 150 | 120 | 5,000,000 | 90 | 1,500,000 | 1,200,000 |
| Glass transition temperature (Tg) | | ° C. | 2 | 1 | 135 | 1 | 6 | 110 |
| Fogging on transparent glass member | | % | <1 | 3 | <1 | <1 | <1 | <1 |
| | | Determination | ○○ | ○ | ○○ | ○○ | ○○ | ○○ |
| Bonding strength between transparent glass member and cured product layer of adhesive (die shear strength) | | N | 23.45 | 24.55 | 22.43 | 13 | 12 | 11 |
| | | Determination | ○○ | ○○ | ○○ | ○ | ○○ | ○ |
| Mold resistance (transfer mold) | | | ○ | ○ | ○ | ○ | ○ | ○ |
| Long-term reliability (high temperature and high humidity test) | | | ○ | ○ | ○ | ○ | ○ | ○ |

TABLE 4

|  |  |  | Example 19 | Example 20 | Example 21 | Comparative Example 1 | Comparative Example 2 | Comparative Example 3 |
|---|---|---|---|---|---|---|---|---|
| (A) Photocurable compound | (1) Monofunctional (meth) acrylate compound | wt % | 5 | 2 | 40 | 16 | 20 | 16 |
|  | (2) Bifunctional (meth) acrylate compound 1 | wt % |  |  |  | 4 | 4 | 4 |
|  | (3) Bifunctional (meth) acrylate compound 2 | wt % |  |  | 22 |  |  |  |
|  | (4) Hexafunctional (meth) acrylate compound | wt % | 10 | 30 |  |  |  |  |
| Photopolymerization initiator | (5) Photopolymerization initiator | wt % | 20 | 17 | 7 | 7 | 7 | 7 |
| (B) Thermosetting compound | (6) Difunctional epoxy compound 1 | wt % |  |  |  |  |  |  |
|  | (7) Difunctional epoxy compound 2 | wt % |  |  | 5 | 10 | 6 |  |
| (C) Photocurable and thermosetting compound | (8) Photocurable and thermosetting compound | wt % | 60 | 40 | 20 | 40 | 40 | 10 |
|  |  |  |  |  |  |  |  | 40 |
| Thermosetting agent | (9) Thermosetting agent | wt % | 5 | 10 | 5 | 22 | 22 | 22 |
| Curing accelerator | (10) Curing accelerator | wt % |  | 1 | 1 | 1 | 1 | 1 |
| Coloring material | (11) Coloring material | wt % |  |  |  |  |  |  |
|  | Total | wt % | 100.0 | 100.0 | 100.0 | 100.0 | 100.0 | 100.0 |
|  | Elastic modulus of B-staged adhesive X at 25° C. | Pa | 17,000,000 | 36,000,000 | 29,900,000 | 200 | 200 | 190 |
|  | Viscosity of B-staged adhesive Y at 40° C. | Pa·s | 1,600,000 | 3,000,000 | 2,600,000 | 170 | 170 | 160 |
|  | Glass transition temperature (Tg) | ° C. | 85 | 100 | 10 | 3 | 3 | 3 |
|  | Fogging on transparent glass member | % | <1 | <1 | <1 | 35 | 6 | 30 |
|  |  | Determination | ○○ | ○○ | ○○ | XX | X | XX |
|  | Bonding strength between transparent glass member and cured product layer of adhesive (die shear strength) | N | 36 | 20 | 33 | 24.9 | 23.54 | 23.86 |
|  |  | Determination | ○○ | ○○ | ○○ | ○○ | ○○ | ○○ |
|  | Mold resistance (transfer mold) |  | ○ | ○ | ○ | — | — | — |
|  | Long-term reliability (high temperature and high humidity test) |  | ○ | ○ | ○ | — | — | — |

EXPLANATION OF SYMBOLS

1: First member
2: Second member
3: Cured product layer of adhesive
3A: Adhesive layer
3B: B-staged adhesive layer
10: Electronic component
11: Image sensor
21: IR cut filter
31: Cured product layer of adhesive
41: Circuit board
42: Lens
43: Lens holding member
51: Discharge unit
52: Light irradiation unit
60: Camera module
70: Electronic component

The invention claimed is:

1. An ink-jet adhesive comprising:
a photocurable compound having a (meth) acryloyl group or a vinyl group and having no cyclic ether group;
a photopolymerization initiator; and
optionally, a thermosetting compound having no (meth) acryloyl group and having a cyclic ether group,
wherein, if the thermosetting compound is present, the ink-jet adhesive comprises the thermosetting compound in an amount of 5 wt % or less, and
wherein, when the ink jet adhesive is irradiated with light having an integrated light amount of 1000 mJ/cm² so that illuminance at a wavelength of 365 nm is 100 mW/cm² to obtain a B staged adhesive X, an elastic modulus of the B-staged adhesive X at 25° C. is 1×10⁵ Pa or more and 2×10⁹ Pa or less.

2. The ink-jet adhesive according to claim 1, comprising a photocurable and thermosetting compound having a (meth) acryloyl group and having a cyclic ether group, wherein
a content of the photocurable and thermosetting compound is 20 wt % or more and 60 wt % or less.

3. The ink-jet adhesive according to claim 1, wherein when the ink-jet adhesive is irradiated with light having an integrated light amount of 20,000 mJ/cm² so that illuminance at a wavelength of 365 nm is 2000 mW/cm² to obtain a B-staged adhesive Y, a viscosity of the B-staged adhesive Y at 40° C. is 80 Pa·s or more and 8000 Pa·s or less.

4. The ink-jet adhesive according to claim 1, the ink-jet adhesive comprising no thermosetting compound.

5. The ink-jet adhesive according to claim 1, the ink-jet adhesive comprising the thermosetting compound, wherein
the thermosetting compound is an epoxy compound having two or more epoxy groups.

6. The ink-jet adhesive according to claim 1, wherein the photocurable compound contains a first photocurable compound having one (meth) acryloyl group and a second photocurable compound having two or more (meth) acryloyl groups.

7. The ink-jet adhesive according to claim 6, wherein the second photocurable compound contains a photocurable compound having six or more (meth) acryloyl groups.

8. The ink-jet adhesive according to claim 1, the ink-jet adhesive comprising a coloring material, wherein a transmittance of the ink-jet adhesive is 10% or less.

9. The ink-jet adhesive according to claim 1, wherein the ink-jet adhesive is an adhesive to be applied in a frame shape onto a surface of a first member.

10. The ink-jet adhesive according to claim 1, wherein the ink-jet adhesive is an adhesive used for bonding a first member and a peripheral edge portion of a second member.

11. A method for producing an electronic component, the method comprising:
an applying step of applying the ink-jet adhesive according to claim 1 onto a surface of a first member via an ink-jet device to form an adhesive layer;
a photocuring step of advancing curing of the adhesive layer by light irradiation to form a B-staged adhesive layer;
an arranging step of arranging a second member on a surface of the B-staged adhesive layer opposite to a first member side; and
a thermosetting step of thermosetting the B-staged adhesive layer by heating,
in the arranging step, the second member being arranged on the surface of the B-staged adhesive layer having a frame shape.

12. The method for producing an electronic component according to claim 11,
wherein
the first member is a semiconductor element, and
the second member is a transparent member.

13. The method for producing an electronic component according to claim 11, wherein the second member is a transparent glass member.

14. An electronic component comprising:
a first member;
a second member; and
a cured product layer of an adhesive bonding the first member and a peripheral edge portion of the second member,
the cured product layer of the adhesive being the cured product layer of the ink-jet adhesive according to claim 1.

15. An electronic component comprising:
a first member;
a second member; and
a cured product layer of an adhesive bonding an upper surface of the first member and a side surface or a lower surface of the second member,
the cured product layer of the adhesive being the cured product layer of the ink-jet adhesive according to claim 1,
the first member, the second member, and the cured product layer of the adhesive forming an internal space.

16. The electronic component according to claim 14, wherein the first member is a semiconductor element, and the second member is a transparent member.

17. The electronic component according to claim 14, wherein the second member is a transparent glass member.

* * * * *